United States Patent
Hanaoka et al.

(10) Patent No.: US 11,901,701 B2
(45) Date of Patent: Feb. 13, 2024

(54) SURFACE EMITTING LASER ELEMENT, SURFACE EMITTING LASER, SURFACE EMITTING LASER DEVICE, LIGHT SOURCE DEVICE, AND DETECTION APPARATUS

(71) Applicants: Katsunari Hanaoka, Miyagi (JP); Masayuki Fujiwara, Miyagi (JP)

(72) Inventors: Katsunari Hanaoka, Miyagi (JP); Masayuki Fujiwara, Miyagi (JP)

(73) Assignee: RICOH COMPANY, LTD., Tokyo (JP)

( * ) Notice: Subject to any disclaimer, the term of this patent is extended or adjusted under 35 U.S.C. 154(b) by 401 days.

(21) Appl. No.: 17/088,599

(22) Filed: Nov. 4, 2020

(65) Prior Publication Data
US 2021/0159671 A1 May 27, 2021

(30) Foreign Application Priority Data
Nov. 22, 2019 (JP) .................. 2019-211382

(51) Int. Cl.
*H01S 5/183* (2006.01)
*H01S 5/02* (2006.01)
(Continued)

(52) U.S. Cl.
CPC .......... *H01S 5/18369* (2013.01); *H01S 5/023* (2021.01); *H01S 5/0206* (2013.01);
(Continued)

(58) Field of Classification Search
CPC .... H01S 5/18369; H01S 5/023; H01S 5/0233; H01S 5/0261; H01S 5/0262; H01S 5/18305; H01S 5/18377; H01S 5/423
See application file for complete search history.

(56) References Cited

U.S. PATENT DOCUMENTS

| 2008/0069168 A1 | 3/2008 | Kim et al. |
| 2011/0123227 A1 | 5/2011 | Hanaoka |

(Continued)

FOREIGN PATENT DOCUMENTS

| JP | 2001-156395 | 6/2001 |
| JP | 2004-289033 | 10/2004 |

(Continued)

OTHER PUBLICATIONS

Office Action dated May 16, 2023 in Japanese Patent Application No. 2019-211382, 7 pages.

*Primary Examiner* — Yuanda Zhang
(74) *Attorney, Agent, or Firm* — XSENSUS LLP

(57) ABSTRACT

A surface emitting laser element includes a first reflecting mirror; an active layer over the first reflecting mirror; a second reflecting mirror over the active layer; and a multilayer film over the second reflecting mirror. The multilayer film has a side surface including one film and inclined with respect to a principal surface of the second reflecting mirror. The multilayer film includes, in a thickness direction, two or more pairs of a first film having a first refractive index and a second film having a second refractive index higher than the first refractive index. The multilayer film has a center portion and a peripheral portion around the center portion in plan view in a direction perpendicular to the principal surface. The peripheral portion includes the side surface.

20 Claims, 23 Drawing Sheets

(51) Int. Cl.
*H01S 5/026* (2006.01)
*H01S 5/023* (2021.01)
*H01S 5/0233* (2021.01)
*H01S 5/0235* (2021.01)
*H01S 5/42* (2006.01)

(52) U.S. Cl.
CPC .......... *H01S 5/0233* (2021.01); *H01S 5/0235* (2021.01); *H01S 5/0261* (2013.01); *H01S 5/0262* (2013.01); *H01S 5/18305* (2013.01); *H01S 5/18311* (2013.01); *H01S 5/18358* (2013.01); *H01S 5/18377* (2013.01); *H01S 5/423* (2013.01)

(56) References Cited

U.S. PATENT DOCUMENTS

| | | |
|---|---|---|
| 2011/0316961 A1 | 12/2011 | Hanaoka |
| 2013/0010822 A1* | 1/2013 | Suzuki ................ H01S 5/18327 372/44.01 |
| 2013/0070039 A1 | 3/2013 | Harasaka et al. |
| 2013/0251408 A1 | 9/2013 | Hanaoka et al. |
| 2014/0219683 A1 | 8/2014 | Harasaka et al. |
| 2015/0357525 A1* | 12/2015 | Sasaki ..................... H01L 33/46 438/32 |
| 2017/0179682 A1* | 6/2017 | Ishii ..................... H01L 31/167 |
| 2017/0214218 A1* | 7/2017 | Tan ....................... H01S 5/0267 |
| 2017/0271851 A1 | 9/2017 | Hanaoka |

FOREIGN PATENT DOCUMENTS

| | | |
|---|---|---|
| JP | 2006-210429 | 8/2006 |
| JP | 2007-157889 A | 6/2007 |
| JP | 2007-201398 | 8/2007 |
| JP | 2010-183071 | 8/2010 |
| JP | 2011-135031 | 7/2011 |
| JP | 2013-008872 | 1/2013 |
| JP | 2016-146417 A | 8/2016 |
| JP | 2019-165198 A | 9/2019 |

* cited by examiner

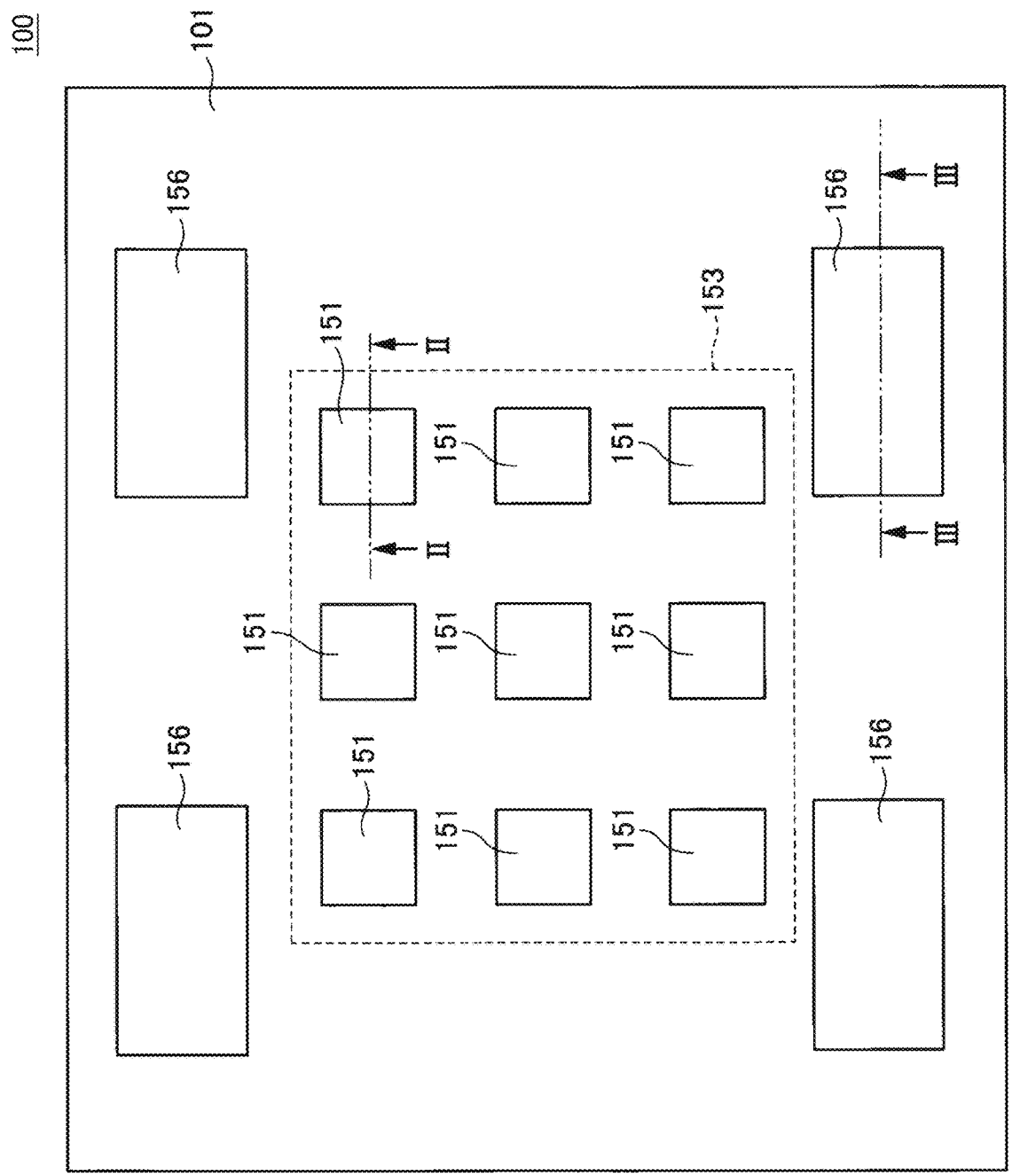
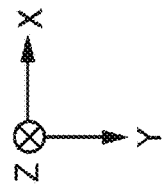
FIG. 1

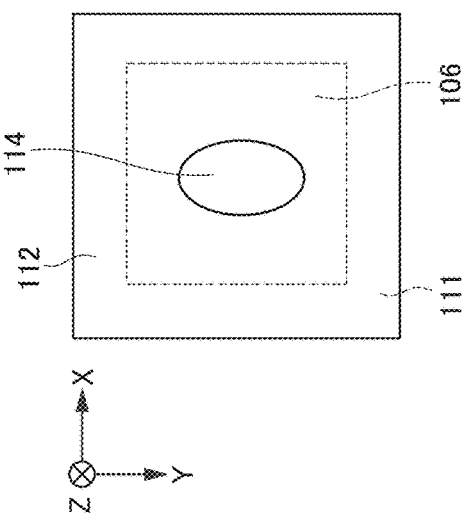
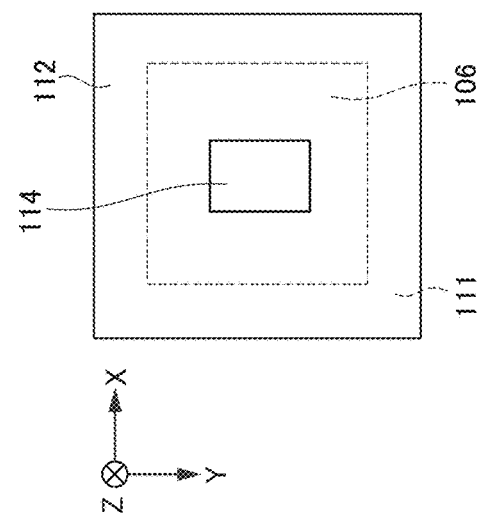
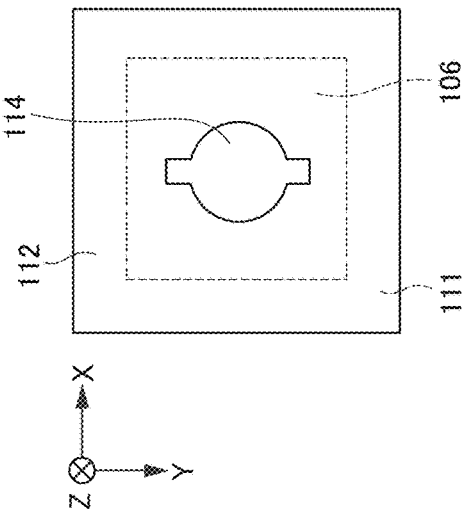
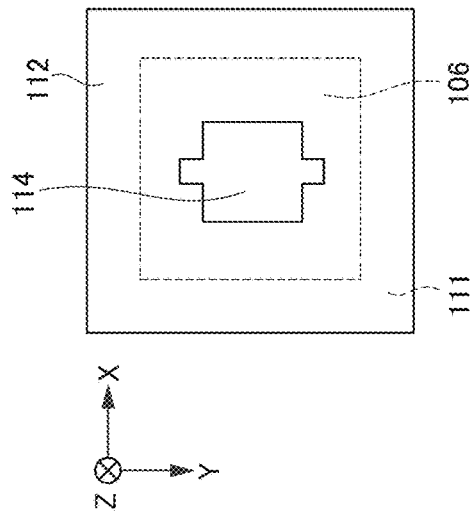
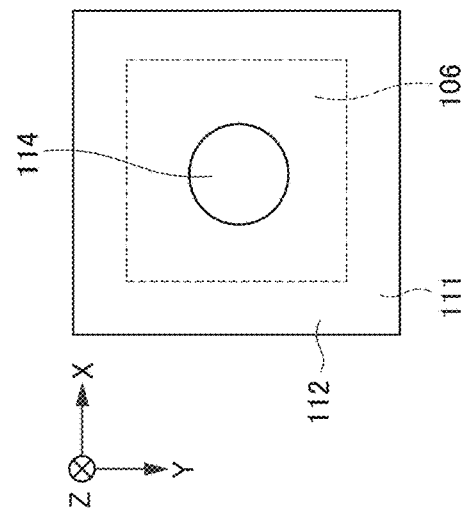
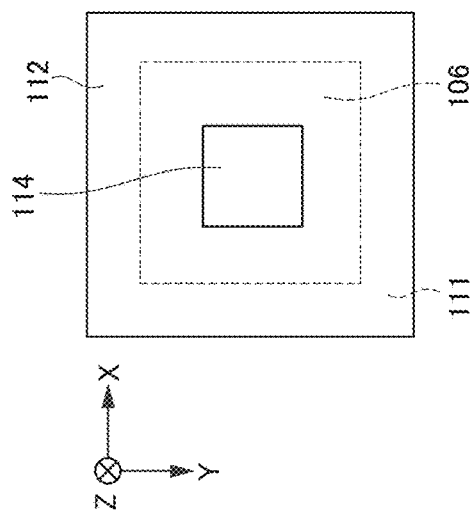

SURFACE EMITTING LASER ELEMENT, SURFACE EMITTING LASER, SURFACE EMITTING LASER DEVICE, LIGHT SOURCE DEVICE, AND DETECTION APPARATUS

CROSS-REFERENCE TO RELATED APPLICATIONS

This patent application is based on and claims priority pursuant to 35 U.S.C. § 119(a) to Japanese Patent Application No. 2019-211382, filed on Nov. 22, 2019, in the Japan Patent Office, the entire disclosure of which is incorporated by reference herein.

BACKGROUND

Technical Field

Embodiments of the present disclosure relate to a surface emitting laser element, a surface emitting laser, a surface emitting laser device, a light source device, and a detection apparatus.

Related Art

A vertical cavity surface emitting laser (VCSEL) is a semiconductor laser that oscillates a laser beam in a direction perpendicular to a substrate. The surface emitting laser has excellent characteristics capable of low-threshold current oscillation, single longitudinal mode oscillation, and arrangement in a two-dimensional array, as compared to an edge-emission semiconductor laser that emits light in a direction parallel to a substrate.

SUMMARY

A surface emitting laser element according to an embodiment of the present disclosure includes a first reflecting mirror; an active layer over the first reflecting mirror; a second reflecting mirror over the active layer; and a multilayer film over the second reflecting mirror. The multilayer film has a side surface inclined with respect to a principal surface of the second reflecting mirror and includes one film. The multilayer film includes, in a thickness direction, two or more pairs of a first film having a first refractive index and a second film having a second refractive index higher than the first refractive index. The multilayer film has a center portion and a peripheral portion around the center portion in plan view in a direction perpendicular to the principal surface. The peripheral portion includes the side surface.

BRIEF DESCRIPTION OF THE DRAWINGS

The aforementioned and other aspects, features, and advantages of the present disclosure would be better understood by reference to the following detailed description when considered in connection with the accompanying drawings, wherein:

FIG. 1 illustrates a layout of a surface emitting laser according to a first embodiment;

FIGS. 23A to 23F illustrate examples of a planar shape of a dielectric multilayer film reflecting mirror.

Figure 2:
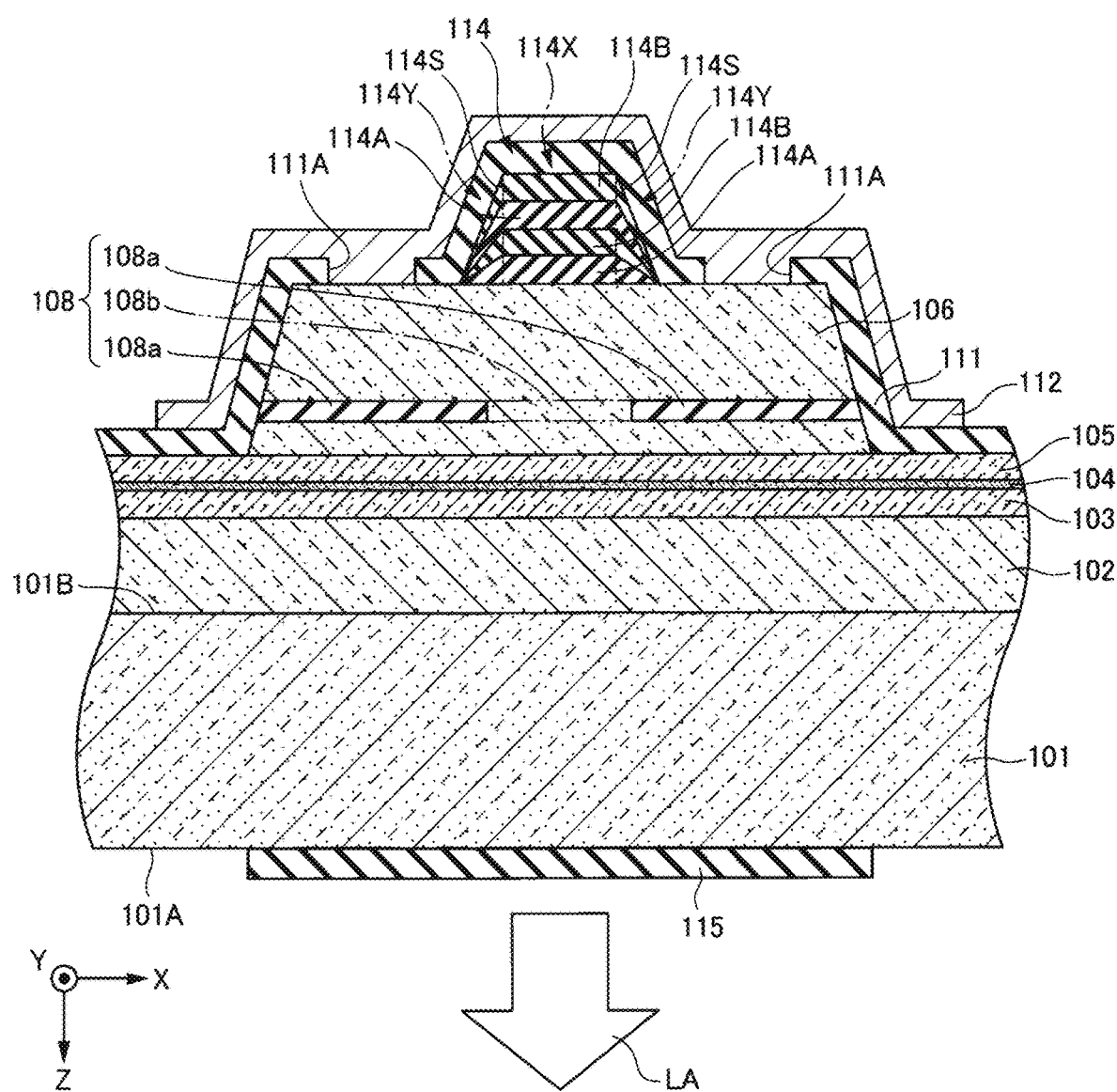
FIG. 2 is a cross-sectional view of an internal structure of the surface emitting laser according to the first embodiment.

The accompanying drawings are intended to depict embodiments of the present disclosure and should not be interpreted to limit the scope thereof. The accompanying drawings are not to be considered as drawn to scale unless explicitly noted.

DETAILED DESCRIPTION OF EMBODIMENTS

In describing embodiments illustrated in the drawings, specific terminology is employed for the sake of clarity.

However, the disclosure of this patent specification is not intended to be limited to the specific terminology so selected and it is to be understood that each specific element includes all technical equivalents that operate in a similar manner and achieve similar results.

Although the embodiments are described with technical limitations with reference to the attached drawings, such description is not intended to limit the scope of the disclosure and all of the components or elements described in the embodiments of this disclosure are not necessarily indispensable.

Referring now to the drawings, embodiments of the present disclosure are described below. In the drawings for explaining the following embodiments, the same reference codes are allocated to elements (members or components) having the same function or shape and redundant descriptions thereof are omitted below.

The embodiment of the present disclosure provide a surface emitting laser element, a surface emitting laser, a surface emitting laser device, a light source device, and a detection apparatus capable of increasing the effect of reducing high-order transverse mode oscillation.

The embodiments of the present disclosure are described below with reference to the accompanying drawings. Note that, in the specification and the drawings, components having substantially the same functional configuration are denoted by the same reference sign, and redundant description may be omitted. In the following description, a laser oscillation direction (an emission direction of a laser beam) is defined as a Z-axis direction, and two directions orthogonal to each other in a plane perpendicular to the Z-axis direction are defined as an X-axis direction and a Y-axis direction in the right-hand system. A positive Z-axis direction is defined as a downward direction. In the description, a plan view refers to a view in the Z-axis direction, that is, a view in a direction perpendicular to a substrate. However, the surface emitting laser element or the like may be used in an upside down state, and may be disposed at any desired angle.

A first embodiment is described. The first embodiment relates to a surface emitting laser including a back-emission surface emitting laser element.

FIG. 1 illustrates a layout of the surface emitting laser according to the first embodiment.

Figure 3:
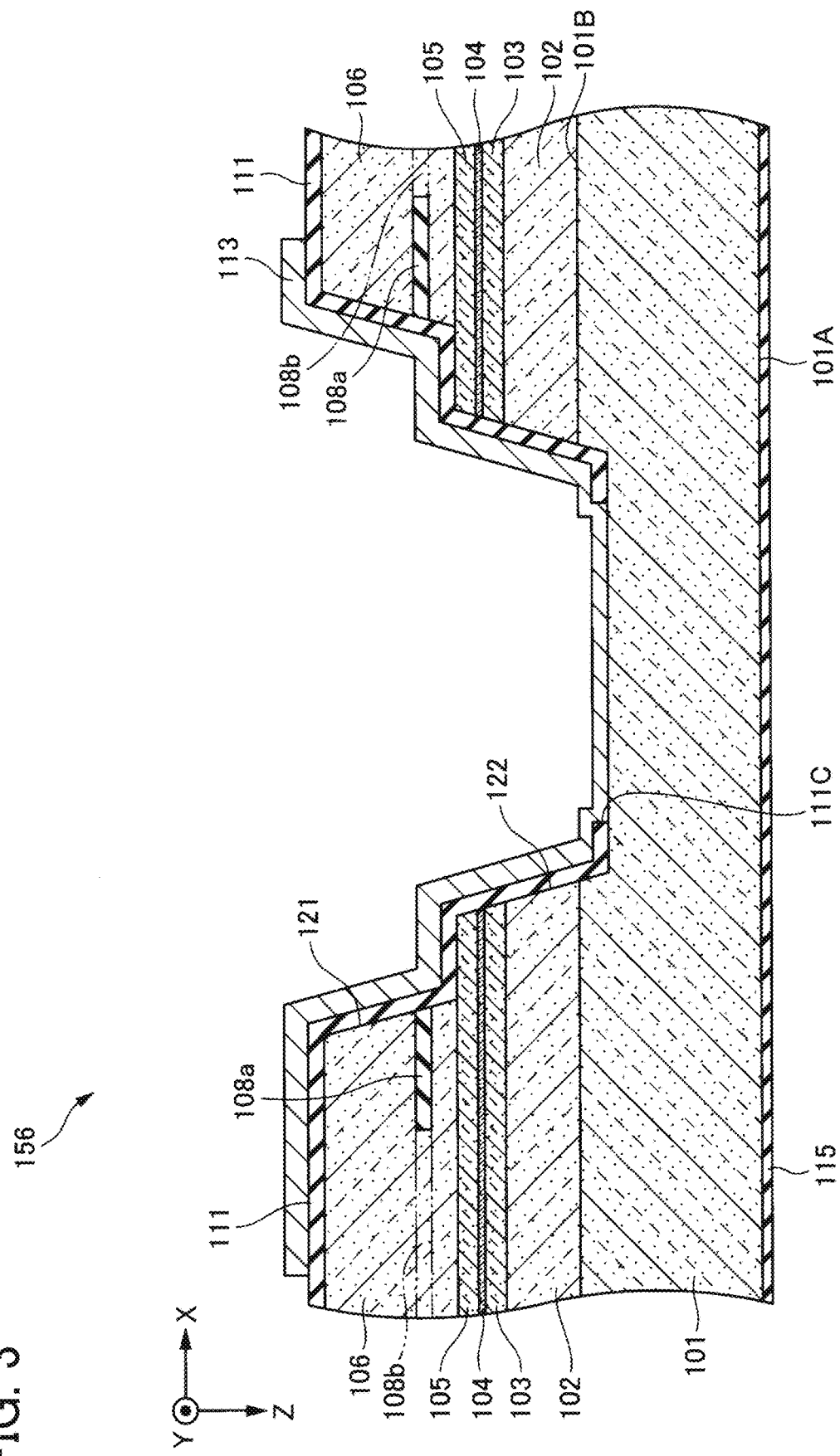
FIG. 3 is another cross-sectional view of the internal structure of the surface emitting laser according to the first embodiment.

FIGS. 2 and 3 are cross-sectional views illustrating an internal structure of the surface emitting laser according to the first embodiment. FIG. 2 corresponds to a cross-sectional view taken along line II-II in FIG. 1. FIG. 3 corresponds to a cross-sectional view taken along line in FIG. 1.

As illustrated in FIG. 1, a surface emitting laser 100 according to the first embodiment includes, for example, nine surface emitting laser elements 151. The nine surface emitting laser elements 151 constitutes a laser element array 153 in which three surface emitting laser elements are arranged in each of the X-axis direction and the Y-axis direction. As illustrated in FIG. 2, the surface emitting laser elements 151 each emit a laser beam LA toward a back surface 101A side of a substrate 101. The number of the surface emitting laser elements 151 included in the laser element array 153 is not limited.

A plurality of, for example, four n-side contact regions 156 for coupling n-side electrodes 113 to electrodes of a mount substrate are provided at locations around the laser element array 153. The number of the n-side contact regions 156 is not limited.

The surface emitting laser 100 is a surface emitting laser having an oscillation wavelength of 940 nm band. As illustrated in FIGS. 2 and 3, the surface emitting laser 100 includes the substrate 101, a lower semiconductor-multilayer-film reflecting mirror 102, a lower spacer layer 103, an active layer 104, an upper spacer layer 105, an upper semiconductor-multilayer-film reflecting mirror 106, an insulator film 111, a p-side electrode 112, an n-side electrode 113, a dielectric multilayer film 114, and an anti-reflection film 115. The lower semiconductor-multilayer-film reflecting mirror 102 is an example of a first reflecting mirror. The active layer 104 is an example of an active layer. The upper semiconductor-multilayer-film reflecting mirror 106 is an example of a second reflecting mirror. The dielectric multilayer film 114 is an example of a multilayer film.

As an example, the substrate 101 is an n-GaAs single-crystal semiconductor substrate in which the normal direction of a mirror-polished surface of a surface (principal surface) is inclined by 15 degrees ($\theta=15$ degrees) in a direction of a crystal orientation [111] A direction with respect to a crystal orientation [100] direction. In other words, the substrate 101 is so-called inclined substrate. Note that the substrate is not limited to the one described above.

The lower semiconductor-multilayer-film reflecting mirror 102 is stacked on the −Z side (upper side) of the substrate 101 via a buffer layer (not illustrated), and has about 26 pairs of a low refractive-index layer made of n-$Al_{0.9}Ga_{0.1}As$ and a high refractive-index layer made of n-$Al_{0.1}Ga_{0.9}As$. A composition-graded layer (not illustrated) having a thickness of 20 nm in which the composition gradually changes from one composition to the other composition is provided between the respective refractive-index layers to reduce the electrical resistance between the respective refractive-index layers. Each of the refractive-index layers includes ½ of the adjacent composition-graded layer, and has an optical thickness of $\lambda/4$, where $\lambda$ denotes an oscillation wavelength. Note that when the optical thickness is $\lambda/4$, the actual thickness D of the layer is $D=\lambda/4n$ (where n denotes a refractive index of a medium of that layer). For example, the reflectivity of the lower semiconductor-multilayer-film reflecting mirror 102 is about 99.6%.

The lower spacer layer 103 is a layer that is stacked on the −Z side (upper side) of the lower semiconductor-multilayer-film reflecting mirror 102 and is made of non-doped $Al_{0.15}Ga_{0.85}As$. The material of the lower spacer layer 103 is not limited to non-doped $Al_{0.15}Ga_{0.85}As$, and may be, for example, non-doped AlGaInP.

The active layer 104 is an active layer that is stacked on the −Z side (upper side) of the lower spacer layer 103 and has a structure of a multi-quantum well including a plurality of quantum well layers and a plurality of barrier layers. The quantum well layers are made of InGaAs, and each barrier layer is made of AlGaAs.

The upper spacer layer 105 is a layer that is stacked on the −Z side (upper side) of the active layer 104 and is made of non-doped $Al_{0.15}Ga_{0.85}As$. Like the lower spacer layer 103, the material of the upper spacer layer 105 is not limited to non-doped $Al_{0.15}Ga_{0.85}As$, and may be, for example, non-doped AlGaInP.

The portion including the lower spacer layer 103, the active layer 104, and the upper spacer layer 105 is also referred to as a resonator structure, and the thickness thereof is an optical thickness corresponding to one wavelength. Note that the active layer 104 is provided at the center of the resonator structure, which is a position corresponding to the antinode in the standing wave distribution of the electric field, so as to obtain a high induced emission rate. In one example, the thicknesses of the respective layers of the lower spacer layer 103, the active layer 104, and the upper spacer layer 105 are set so that single longitudinal mode oscillation is obtained with 940 nm, which is the oscillation wavelength. In another example, the relative relationship (detuning) between the resonance wavelength and the emission wavelength (composition) of the active layer 104 is adjusted so that the oscillation threshold current of the surface emitting laser element 151 is the smallest at room temperature.

The upper semiconductor-multilayer-film reflecting mirror 106 is stacked on the −Z side (upper side) of the upper spacer layer 105, and has about 30 pairs of a low refractive-index layer made of p-$Al_{0.9}Ga_{0.1}As$ and a high refractive-index layer made of p-$Al_{0.1}Ga_{0.9}As$. A composition-graded layer (not illustrated) in which the composition gradually changes from one composition to the other composition is provided between the respective refractive-index layers to reduce the electrical resistance between the respective refractive-index layers. Each of the refractive-index layers includes ½ of the adjacent composition-graded layer, and has an optical length of λ/4 where λ denotes the oscillation wavelength. A GaAs contact layer (not illustrated) for ohmic conduction is provided on an upper surface of the upper semiconductor-multilayer-film reflecting mirror 106. The reflectivity of the upper semiconductor-multilayer-film reflecting mirror 106 is almost equal to the reflectivity of the lower semiconductor-multilayer-film reflecting mirror 102, and is, for example, about 99.6%.

In one of the low refractive-index layers of the upper semiconductor-multilayer-film reflecting mirror 106, a selective oxide layer 108 made of p-$Al_{0.98}Ga_{0.02}As$ is inserted to have a thickness of about 30 nm. The insertion position of the selective oxide layer 108 is, for example, a position corresponding to the second node from the active layer 104 in the standing wave distribution of the electric field. The selective oxide layer 108 includes a non-oxidized region 108b and an oxidized region 108a around the non-oxidized region 108b.

The anti-reflection film 115 is formed on the +Z side (lower side) surface (back surface 101A) of the substrate 101. The anti-reflection film 115 is a non-reflective coating film for 940 nm which is the oscillation wavelength.

In the surface emitting laser element 151, as illustrated in FIG. 2, the upper semiconductor-multilayer-film reflecting mirror 106 has a mesa structure. The bottom portion of the mesa structure may be in the middle of the resonator structure, and may reach the lower semiconductor-multilayer-film reflecting mirror 102. The non-oxidized region 108b is located at the center of the mesa structure in plan view. The dielectric multilayer film 114 is stacked on the −Z side (upper side) of the upper semiconductor-multilayer-film reflecting mirror 106 so as to overlap the non-oxidized region 108b in plan view. In plan view, the dielectric multilayer film 114 is smaller than the upper semiconductor-multilayer-film reflecting mirror 106.

The dielectric multilayer film 114 has at least two pairs of dielectric films having different refractive indices in the thickness direction. For example, there are two pairs of a low refractive-index film 114A and a high refractive-index film 114B having a refractive index higher than that of the low refractive-index film 114A. In each pair, the low refractive-index film 114A is located on the +Z side (lower side) with respect to the high refractive-index film 114B. That is, the high refractive-index film 114B is located at the surface of the dielectric multilayer film 114. For example, silicon oxide (SiOx) may be used as the material of the low refractive-index film 114A, and tantalum oxide (TaOx), titanium oxide ($TiO_2$), or silicon nitride (SiN) may be used as the material of the high refractive-index film 114B. The low refractive-index film 114A is an example of a first film, and the high refractive-index film 114B is an example of a second film.

The dielectric multilayer film 114 has a center portion 114X and a peripheral portion 114Y around the center portion 114X in plan view. In plan view, the peripheral portion 114Y is continuous with the center portion 114X, surrounds the center portion 114X, and has a side surface 114S of the dielectric multilayer film 114. The surface on the −Z side (upper side) of the center portion 114X is flat. The side surface 114S of the dielectric multilayer film 114 is inclined with respect to the principal surface of the upper semiconductor-multilayer-film reflecting mirror 106. The thickness of the peripheral portion 114Y decreases as being away from the center portion 114X. The dielectric multilayer film 114 has a frustum shape that widens as being toward the upper semiconductor-multilayer-film reflecting mirror 106. The dielectric multilayer film 114 has, for example, a truncated cone shape. The section perpendicular to the XY plane of the dielectric multilayer film 114 has a trapezoidal shape. The end portion of the dielectric multilayer film 114 has a tapered shape.

In the center portion 114X, the thicknesses of the low refractive-index films 114A and the thicknesses of the high refractive-index films 114B are each the optical thickness of λ/4 where λ is the oscillation wavelength. For example, the refractive index of silicon oxide is 1.46, and the refractive index of tantalum oxide is 2.18. Thus, when the low refractive-index film 114A is a silicon oxide film and the high refractive-index film 114B is a tantalum oxide film, in the center portion 114X, the thickness of the low refractive-index film 114A is 161 nm, and the thickness of the high refractive-index film 114B is 108 nm.

The ratio of the thickness of the low refractive-index film 114A to the thickness of the high refractive-index film 114B is constant entirely in the center portion 114X and the peripheral portion 114Y. Thus, in any portion of the peripheral portion 114Y, "(the thickness of the low refractive-index film 114A):(the thickness of the high refractive-index film 114B)" is "161:108". In the center portion 114X, according to the first embodiment, the thickness of the low refractive-index film 114A and the thickness of the high refractive-index film 114B are constant. In the peripheral portion 114Y, both the thickness of the low refractive-index film 114A and the thickness of the high refractive-index film 114B simply decrease as being away from the center portion 114X. That is, the side surface 114S of the dielectric multilayer film 114 includes one high refractive-index film 114B included in the upper pair.

The reflectivity of a portion where the center portion 114X of the dielectric multilayer film 114 overlaps the upper semiconductor-multilayer-film reflecting mirror 106 in plan view, that is, the reflectivity of the center portion of the mesa structure is, for example, about 99.9%. The reflectivity of a portion where the peripheral portion 114Y of the dielectric multilayer film 114 overlaps the upper semiconductor-multilayer-film reflecting mirror 106 in plan view monotonously decreases as the thickness of the dielectric multilayer film 114 decreases. That is, the reflectivity of the portion where the peripheral portion 114Y of the dielectric multilayer film 114 overlaps the upper semiconductor-multilayer-film reflecting mirror 106 in plan view monotonously decreases to about 99.6% as being away from the center portion 114X.

In the surface emitting laser element 151, the insulator film 111 covers the dielectric multilayer film 114, the upper semiconductor-multilayer-film reflecting mirror 106, and the upper spacer layer 105. The insulator film 111 is, for example, a silicon nitride (SiN) film. An opening 111A is formed in the insulator film 111 to expose a portion of the upper surface of the upper semiconductor-multilayer-film reflecting mirror 106 around the dielectric multilayer film 114 in the surface emitting laser element 151. The p-side electrode 112 is formed on the insulator film 111. The p-side electrode 112 is in contact with the upper surface of the upper semiconductor-multilayer-film reflecting mirror 106 via the opening 111A. The p-side electrode 112 includes, for example, a titanium (Ti) film, a platinum (Pt) film, and a gold (Au) film sequentially stacked on the −Z side (upper side). The p-side electrode 112 of the surface emitting laser element 151 is coupled to a p-side electrode of a driver IC or a submount by flip-chip mounting.

As illustrated in FIG. 3, in the n-side contact region 156, a groove 121 is formed in the upper semiconductor-multilayer-film reflecting mirror 106. Inside the groove 121, a groove 122 is formed in the upper spacer layer 105, the active layer 104, the lower spacer layer 103, the lower semiconductor-multilayer-film reflecting mirror 102, and a surface layer portion of the substrate 101.

In the n-side contact region 156, the insulator film 111 covers the upper semiconductor-multilayer-film reflecting mirror 106, the upper spacer layer 105, the active layer 104, the lower spacer layer 103, the lower semiconductor-multilayer-film reflecting mirror 102, and the substrate 101. An opening 111C is formed in the insulator film 111 to expose a portion of a surface 101B of the substrate 101 at the bottom of the groove 122. The n-side electrode 113 is formed on the insulator film 111. The n-side electrode 113 is in contact with the surface 101B of the substrate 101 inside the opening 111C. The n-side electrode 113 has a portion located on the −Z side (upper side) of the upper semiconductor-multilayer-film reflecting mirror 106 in the n-side contact region 156. The n-side electrode 113 includes, for example, a gold-germanium alloy (AuGe) film, a nickel (Ni) film, and a gold (Au) film sequentially stacked on the −Z side (upper side). The n-side electrode 113 is coupled to an n-side electrode of a driver IC or a submount by flip-chip mounting in the n-side contact region 156.

Figure 4:
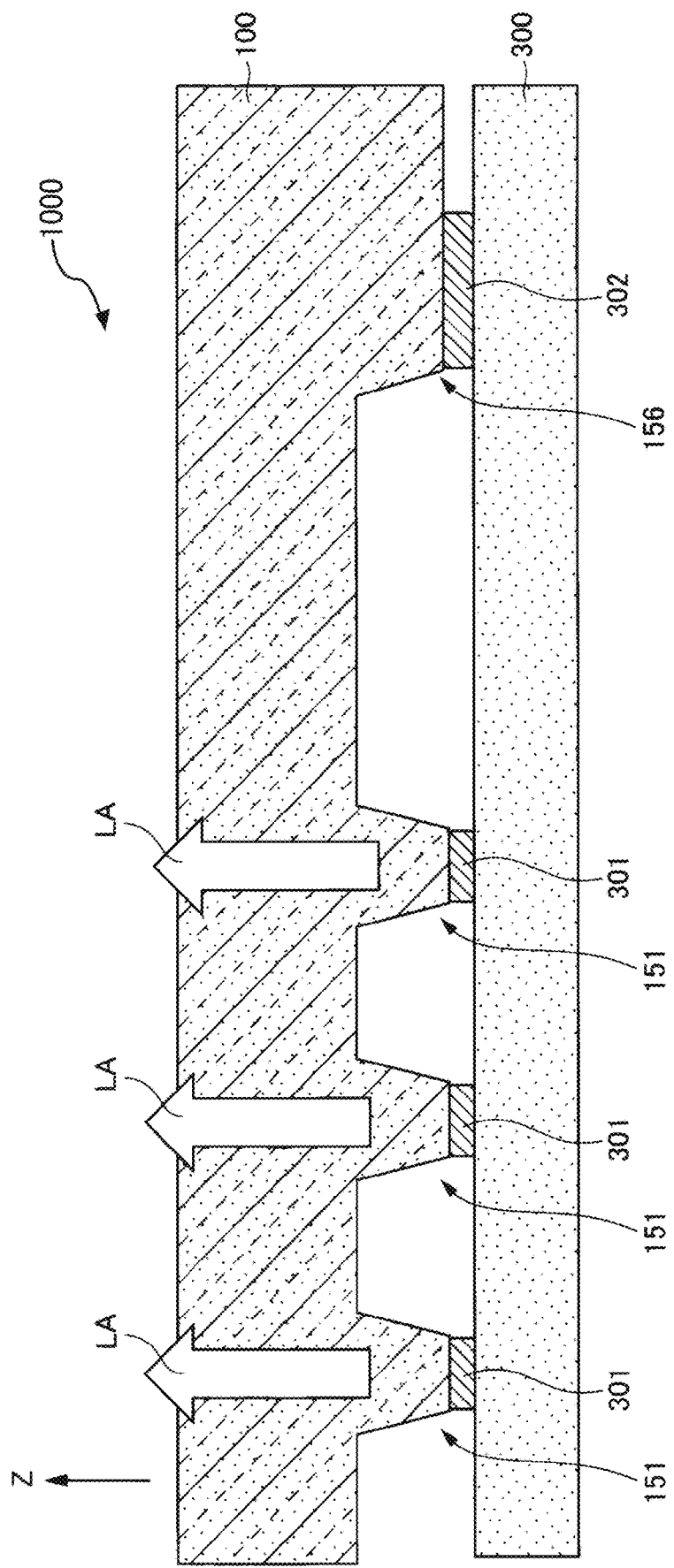
FIG. 4 is a schematic view of an example case where the surface emitting laser in FIG. 1 is used.

The surface emitting laser 100 is mounted on, for example, a submount and is used. FIG. 4 is a schematic view illustrating an example of use of the surface emitting laser 100. The submount and the surface emitting laser 100 mounted on the submount are included in a surface emitting laser device 1000.

In this example of use, as illustrated in FIG. 4, the surface emitting laser 100 is mounted on a driver IC 300 by flip-chip mounting. The p-side electrode 112 of the surface emitting laser element 151 is electrically coupled to a p-side electrode provided on the driver IC 300 via a conductive material 301. The n-side electrode 113 of the surface emitting laser element 151 is electrically coupled to an n-side electrode provided on the driver IC 300 via a conductive material 302 in the n-side contact region 156. The surface emitting laser 100 is driven by the driver IC 300. The driver IC 300 is an example of a driver for a surface emitting laser.

The object on which the surface emitting laser 100 is mounted is not limited to the driver IC 300. For example, the surface emitting laser 100 may be mounted on a submount.

In the surface emitting laser element 151, the fundamental transverse mode has a mode distribution in a center portion of the surface emitting laser element 151, and the high-order transverse mode orthogonal to the fundamental transverse mode has a main mode distribution in a peripheral portion of the surface emitting laser element 151. The reflectivity of the portion where the center portion 114X of the dielectric multilayer film 114 overlaps the upper semiconductor-multilayer-film reflecting mirror 106, that is, the reflectivity of the center portion of the mesa structure in plan view is, for example, about 99.9%. That is, the reflectivity of the center portion provided with the dielectric multilayer film 114 is higher than the reflectivity of the peripheral portion in the periphery of the center portion. Thus, the reflection loss of the fundamental transverse mode having the mode distribution in the center portion of the surface emitting laser element 151 is smaller than the reflection loss of the high-order transverse mode having the main mode distribution in the peripheral portion. Consequently, oscillation of the high-order transverse mode is reduced, the fundamental transverse mode is selectively oscillated, and the laser beam LA is output from the back surface 101A side of the substrate 101.

The oscillation of the high-order transverse mode may widen the kink included in the current-light output characteristics and the angle of divergence. In the surface emitting laser element 151, however, since the oscillation of the high-order transverse mode is reduced, the linearity of the current-light output characteristics is excellent, and the angle of divergence is also reduced to be very narrow. For example, the laser beam radiated from the individual surface emitting laser element 151 at an output of 3 mW can provide a very narrow angle of divergence within 5° at the full width at half maximum. Thus, the fundamental transverse mode oscillation is maintained to a high injection level, and the laser beam LA having a unimodal narrow beam radiation angle can be provided.

The dielectric multilayer film 114 includes the two pairs of the low refractive-index film 114A and the high refractive-index film 114B, and hence the high-order transverse mode oscillation is likely to be reduced. That is, as the number of pairs of the low refractive-index film 114A and the high refractive-index film 114B increases, the reflectivity of the portion where the center portion 114X overlaps the upper semiconductor-multilayer-film reflecting mirror 106 in plan view increases, and the high-order transverse mode oscillation is likely to be reduced. In the back-emission surface emitting laser element, the number of pairs is preferably five or more, more preferably six or more, and further preferably seven or more.

Since the side surface 114S of the dielectric multilayer film 114 is inclined with respect to the principal surface of the upper semiconductor-multilayer-film reflecting mirror 106, it is possible to obtain a large dimensional tolerance, and it is possible to increase the manufacturing yield.

Figure 5:
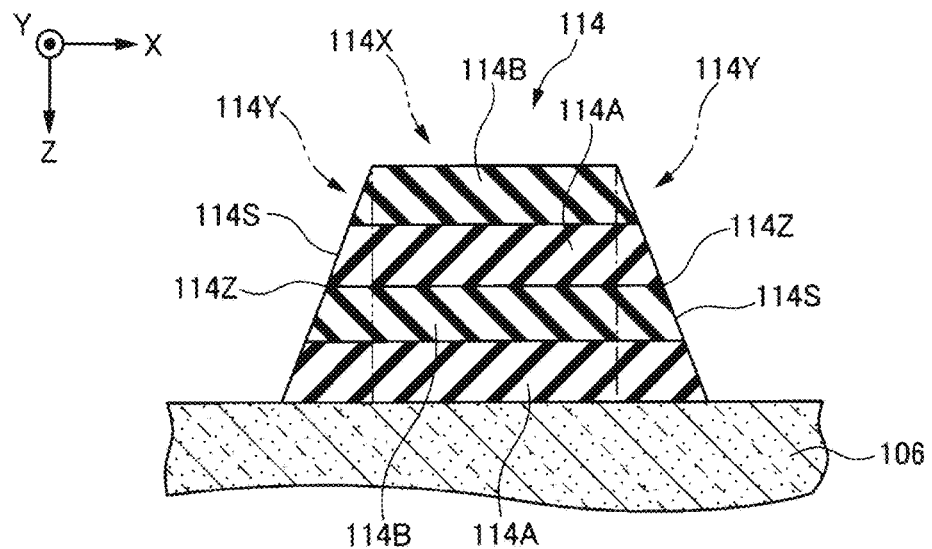
FIG. 5 is a cross-sectional view of an internal structure of a surface emitting laser according to a reference example.

However, when the peripheral portion 114Y includes a portion where the optical thickness (the optical path length of the laser beam having the wavelength of λ) is an integer multiple of λ/2, the dimensional tolerance of any desired size may not be obtained. FIG. 5 is a cross-sectional view illustrating an internal structure of a surface emitting laser according to a reference example.

In the reference example, as illustrated in FIG. 5, a dielectric multilayer film 114 has a center portion 114X and a peripheral portion 114Y, and the peripheral portion 114Y has a side surface 114S of the dielectric multilayer film 114, as in the first embodiment. Entirely in the center portion 114X and the peripheral portion 114Y, the thicknesses of the low refractive-index films 114A and the thicknesses of the high refractive-index films 114B are each the optical thickness of λ/4 where λ is the oscillation wavelength. That is, the thicknesses of the low refractive-index films 114A and the high refractive-index films 114B in both pairs in the peripheral portion 114Y are the same as the thicknesses of those in the center portion 114X. Each of the side surfaces of the low refractive-index films 114A and the high refractive-index films 114B in both pairs is inclined with respect to the principal surface of the upper semiconductor-multilayer-film reflecting mirror 106. In the reference example, the side surface 114S of the dielectric multilayer film 114 is entirely in contact with the air.

The other configurations are similar to those in the first embodiment.

In the reference example, at a boundary end portion 114Z where the boundary between the low refractive-index film 114A included in the upper pair and the high refractive-index film 114B included in the lower pair in the peripheral portion 114Y is exposed from the side surface 114S, the thickness of the dielectric multilayer film 114 is equal to the sum of the thicknesses of the low refractive-index films 114A and the thicknesses of the high refractive-index films 114B. The side surface 114S is in contact with the air. At the boundary end portion 114Z, the optical thickness (the optical path length of the laser beam having the wavelength of λ) is equal to λ/2. Thus, the reflectivity of the dielectric multilayer film 114 at the boundary end portion 114Z is substantially the same as the reflectivity thereof in the center portion 114X. When a dimensional shift occurs, the reflectivity of the peripheral portion 114Y may be increased, and hence the high-order transverse mode oscillation may not be sufficiently reduced.

In contrast, according to the first embodiment, the side surface 114S of the dielectric multilayer film 114 includes one high-refractive-index film 114B, and the optical thickness of the peripheral portion 114Y is shifted from an integer multiple of λ/2 entirely in the peripheral portion 114Y. That is, the peripheral portion 114Y does not include a portion where the optical thickness (the optical path length of the laser beam having the wavelength of λ) is an integer multiple of λ/2. In particular, the reflectivity of the portion where the peripheral portion 114Y overlaps the upper semiconductor-multilayer-film reflecting mirror 106 in plan view monotonously decreases as being away from the center portion 114X. Accordingly, even when a dimensional shift occurs, it is possible to sufficiently reduce the high-order transverse mode oscillation. Thus, according to the first embodiment, it is possible to increase the manufacturing yield while reducing the high-order transverse mode oscillation.

A method for manufacturing the surface emitting laser 100 is described next. Note that a structure in which a plurality of semiconductor layers are stacked on the substrate 101 as described above is also referred to as a "stacked body" in the following description. FIGS. 6 to 20 are cross-sectional views illustrating a method for manufacturing the surface emitting laser 100 according to the first embodiment. FIGS. 6 to 14 illustrate a portion corresponding to the surface emitting laser element 151. FIGS. 15 to 20 illustrate a portion corresponding to the n-side contact region 156.

Figure 6:
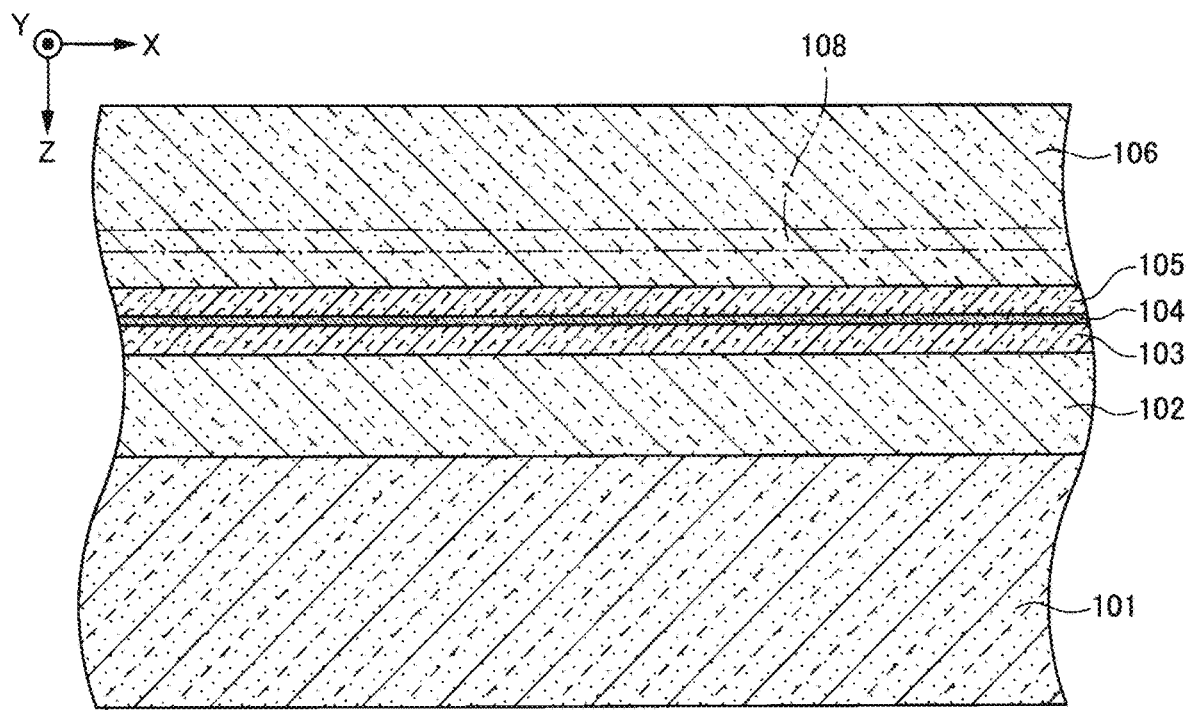
FIG. 6 is a cross-sectional view of the surface emitting laser in FIG. 1 for describing a method of manufacturing the surface emitting laser.

First, as illustrated in FIG. 6, a portion from the lower semiconductor-multilayer-film reflecting mirror 102 to the upper semiconductor-multilayer-film reflecting mirror 106 of the stacked body is formed through crystal growth by a metal organic chemical vapor deposition (MOCVD) method or a molecular beam epitaxy (MBE) method.

In the case of the MOCVD method, trimethyl aluminum (TMA), trimethyl gallium (TMG), or trimethyl indium (TMI) is used as the raw material of the group III; and phosphine ($PH_3$) or arsine ($AsH_3$) is used as the raw material of the group V. Carbon tetrabromide ($CBr_4$) or dimethyl zinc (DMZn) is used as the raw material of the p-type dopant; and hydrogen selenide ($H_2Se$) is used as the raw material of the n-type dopant.

Figure 7:
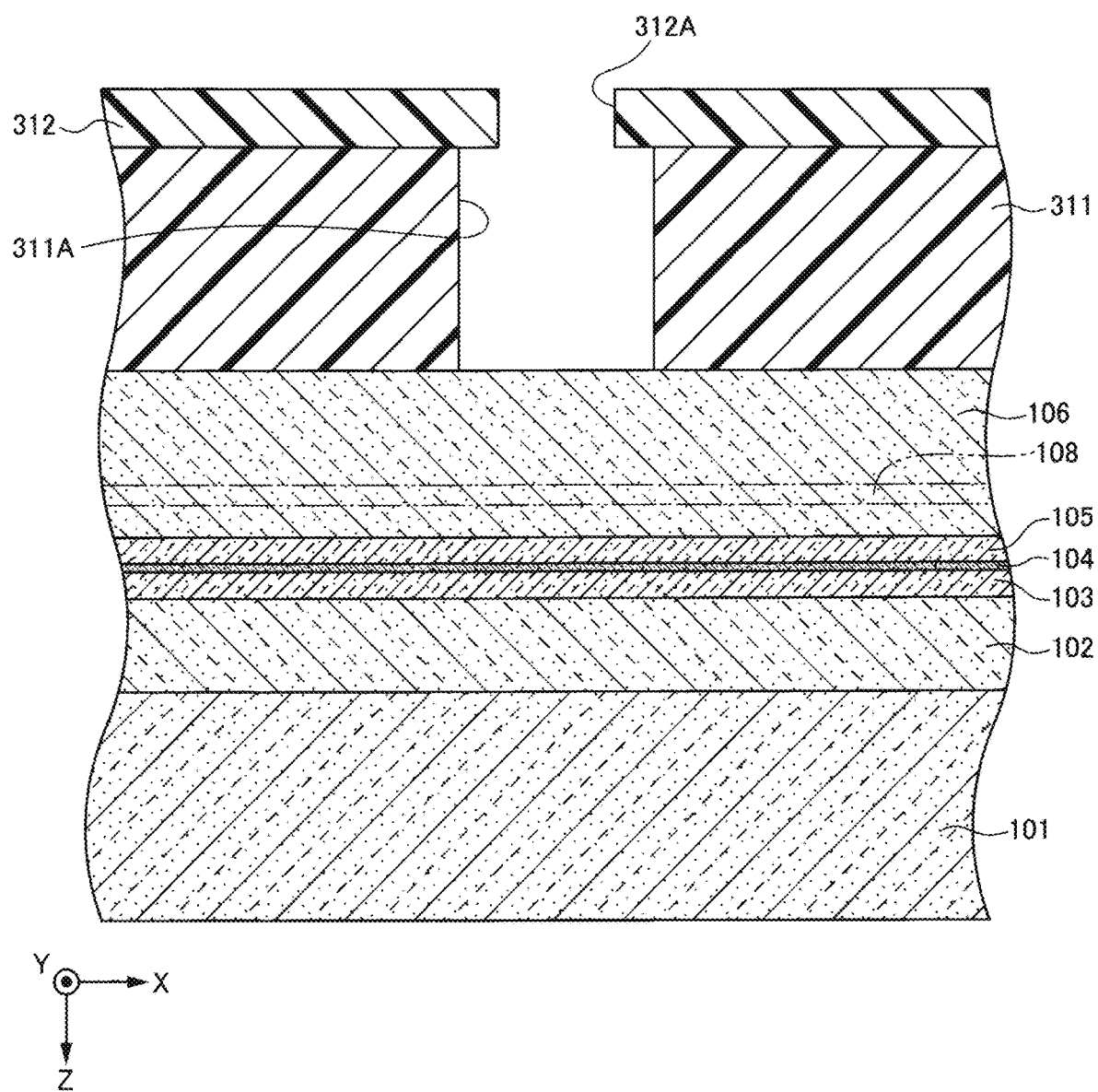
FIG. 7 is another cross-sectional view of the surface emitting laser in FIG. 1 for describing the method of manufacturing the surface emitting laser.

Then, as illustrated in FIG. 7, a resist mask 310 having an overhang shape is formed on the upper semiconductor-multilayer-film reflecting mirror 106. The resist mask 310 includes a first resist mask 311 on the upper semiconductor-multilayer-film reflecting mirror 106 and a second resist mask 312 on the first resist mask 311. The first resist mask 311 has an opening 311A having substantially the same size as that of the dielectric multilayer film 114 to be formed in plan view. The second resist mask 312 has an opening 312A that is narrower than the opening 311A.

To form the resist mask 310, a first photoresist having a first photosensitivity is formed on the upper semiconductor-multilayer-film reflecting mirror 106 by spin coating, and then a second photoresist having a second photosensitivity lower than the first photosensitivity is formed on the first photoresist by spin coating. Between the formation of the first photoresist and the formation of the second photoresist, the first photoresist is baked at 150° C. for 90 seconds using a hot plate to reduce the elution of the first photoresist. After the second photoresist is formed, the openings 311A and 312A are formed in the portion where the dielectric multilayer film 114 is to be formed by exposure to light and development. Since the first photoresist and the second photoresist having the different photosensitivities are used, it is possible to form the resist mask 310 having an overhang shape by one occasion of exposure to light and development.

Figure 8:
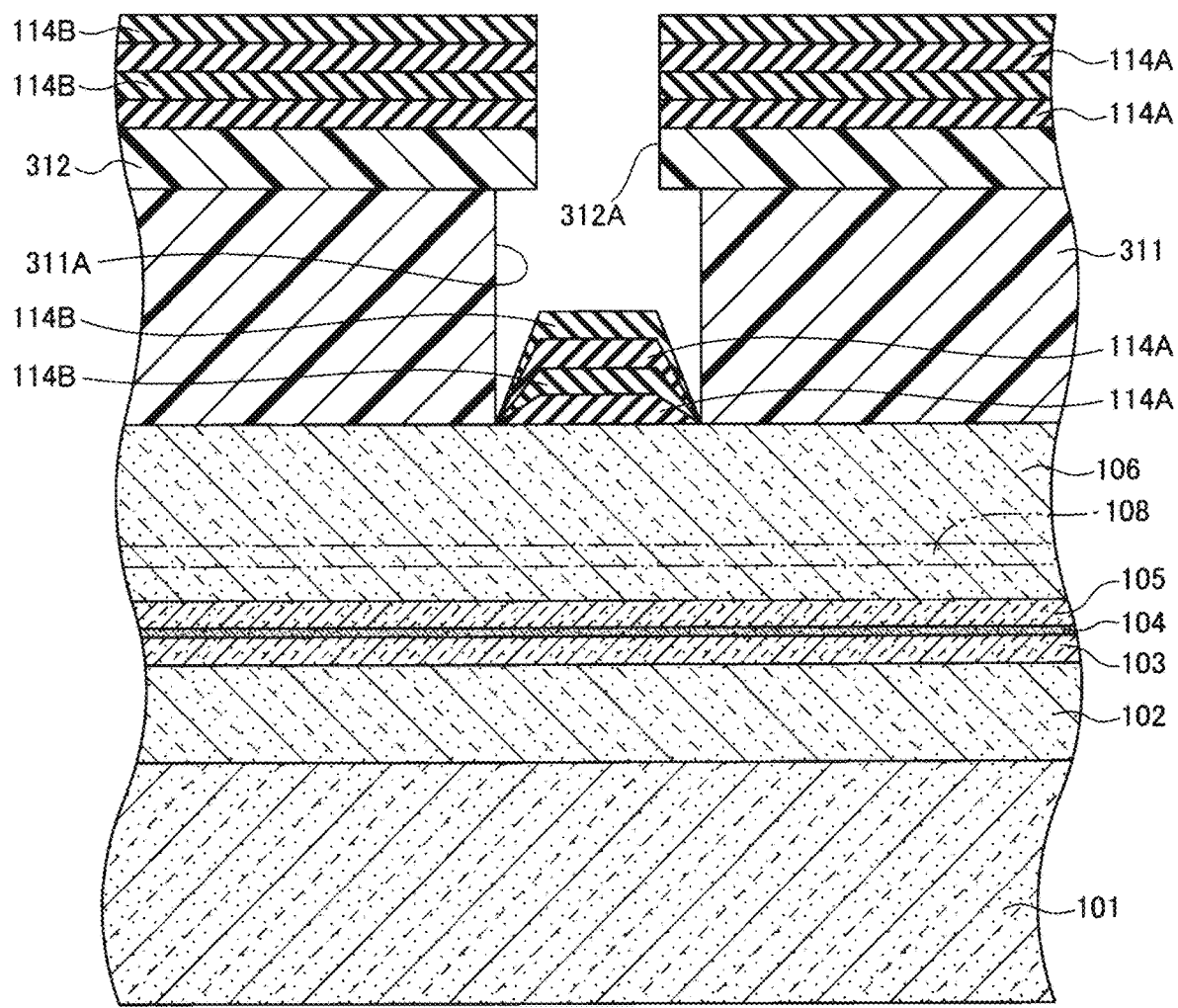
FIG. 8 is another cross-sectional view of the surface emitting laser in FIG. 1 for describing the method for manufacturing the surface emitting.

Then, as illustrated in FIG. 8, two pairs of the low refractive-index film 114A and the high refractive-index film 114B are formed by vacuum vapor deposition. For example, a silicon oxide film having a refractive index of 1.46 and a thickness of 161 nm is formed as the low refractive-index film 114A, and a tantalum oxide film having a refractive index of 2.18 and a thickness of 108 nm is formed as the high refractive-index film 114B. Each of the thicknesses of the low refractive-index films 114A and the high refractive-index films 114B corresponds to ¼ of the wavelength of 940 nm.

Figure 9:
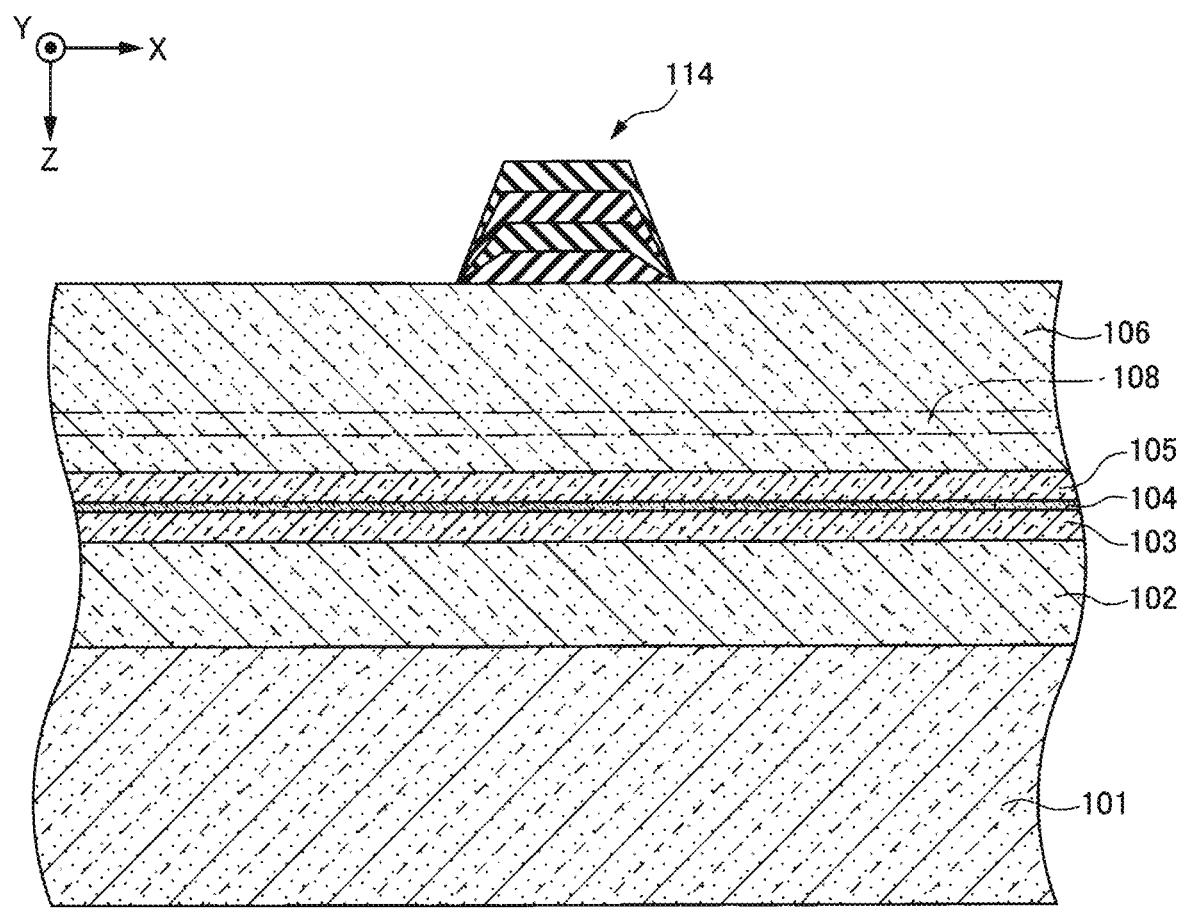
FIG. 9 is another cross-sectional view of the surface emitting laser in FIG. 1 for describing the method for manufacturing the surface emitting laser.

Then, as illustrated in FIG. 9, the resist mask 310 is removed together with the low refractive-index film 114A and the high refractive-index film 114B situated thereon by using N-methyl-2-pyrrolidone (NMP). Consequently, the dielectric multilayer film 114 is provided on the upper semiconductor-multilayer-film reflecting mirror 106.

In order to obtain a desired inclination on the side surface 114S of the dielectric multilayer film 114, in one example, the thickness of the first resist mask 311 is two to three times the thickness of the dielectric multilayer film 114. For example, the thicknesses of the first resist mask 311 and the second resist mask 312 are each 700 nm to 750 nm. When the first resist mask 311 is excessively thin, the low refractive-index film 114A and the high refractive-index film 114B are less spread to the peripheries thereof when being formed. Thus, the side surface 114S may have a shape whose bottom is extended, and the contribution of the reflectivity may decrease, or the bottom portion of the dielectric multilayer film 114 may be less likely to have sufficient dimensional accuracy. When the first resist mask 311 is excessively thick, the low refractive-index film 114A and the high refractive-index film 114B are more likely to spread to the peripheries thereof when being formed. Thus, the top portion of the dielectric multilayer film 114 is larger than the opening 312A of the second resist mask 312, and thus it is difficult to obtain sufficient dimensional accuracy for the top portion of the dielectric multilayer film 114, or the dimension of the peripheral portion 114Y decreases.

For example, when an alphabet a denotes a dimension of the opening 311A of the first resist mask 311, b denotes a dimension of the opening 312A of the second resist mask 312, and c denotes a design value of a dimension of the dielectric multilayer film 114, in one example, "c=b+(a−b)/2" is established. This is because, when this relationship is established, the dimensional tolerance is symmetrical in the plus shift direction and the minus shift direction.

Figure 10:
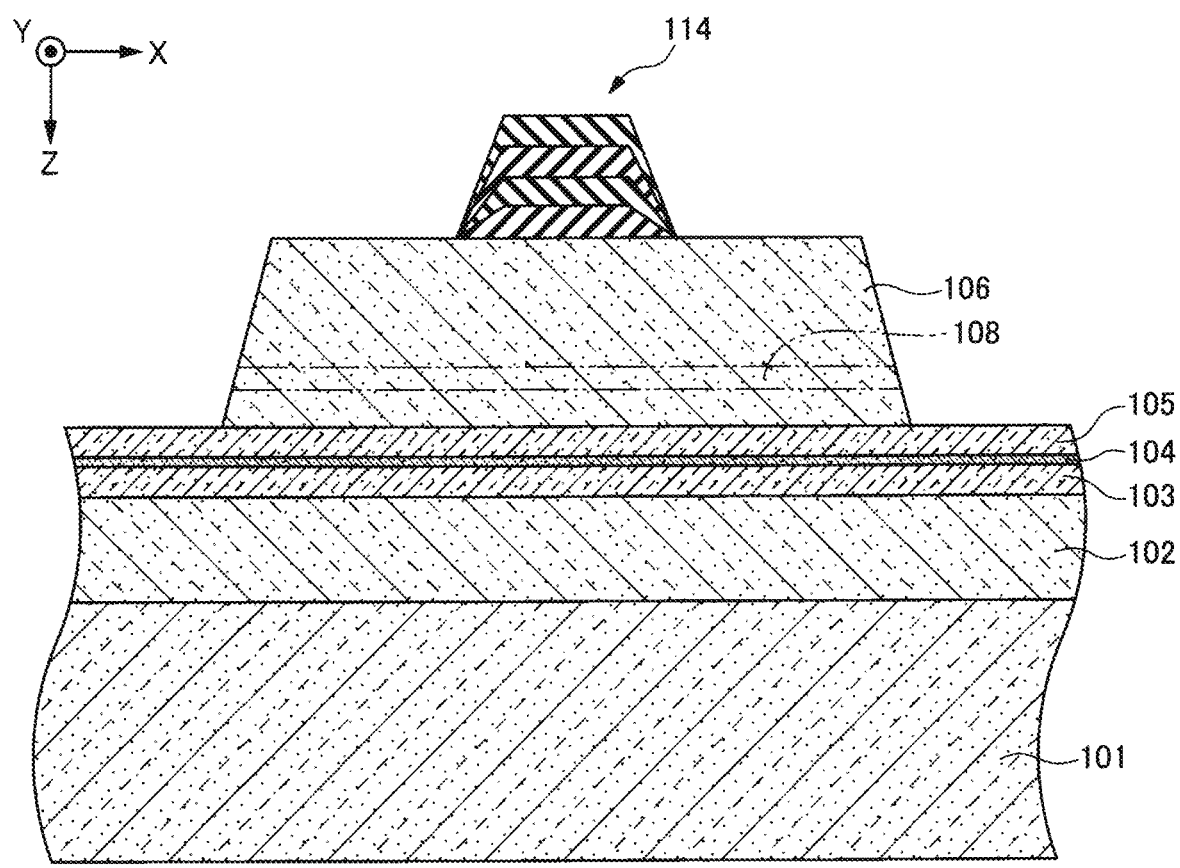
FIG. 10 is another cross-sectional view of the surface emitting laser in FIG. 1 for describing the method for manufacturing the surface emitting laser.
Figure 15:
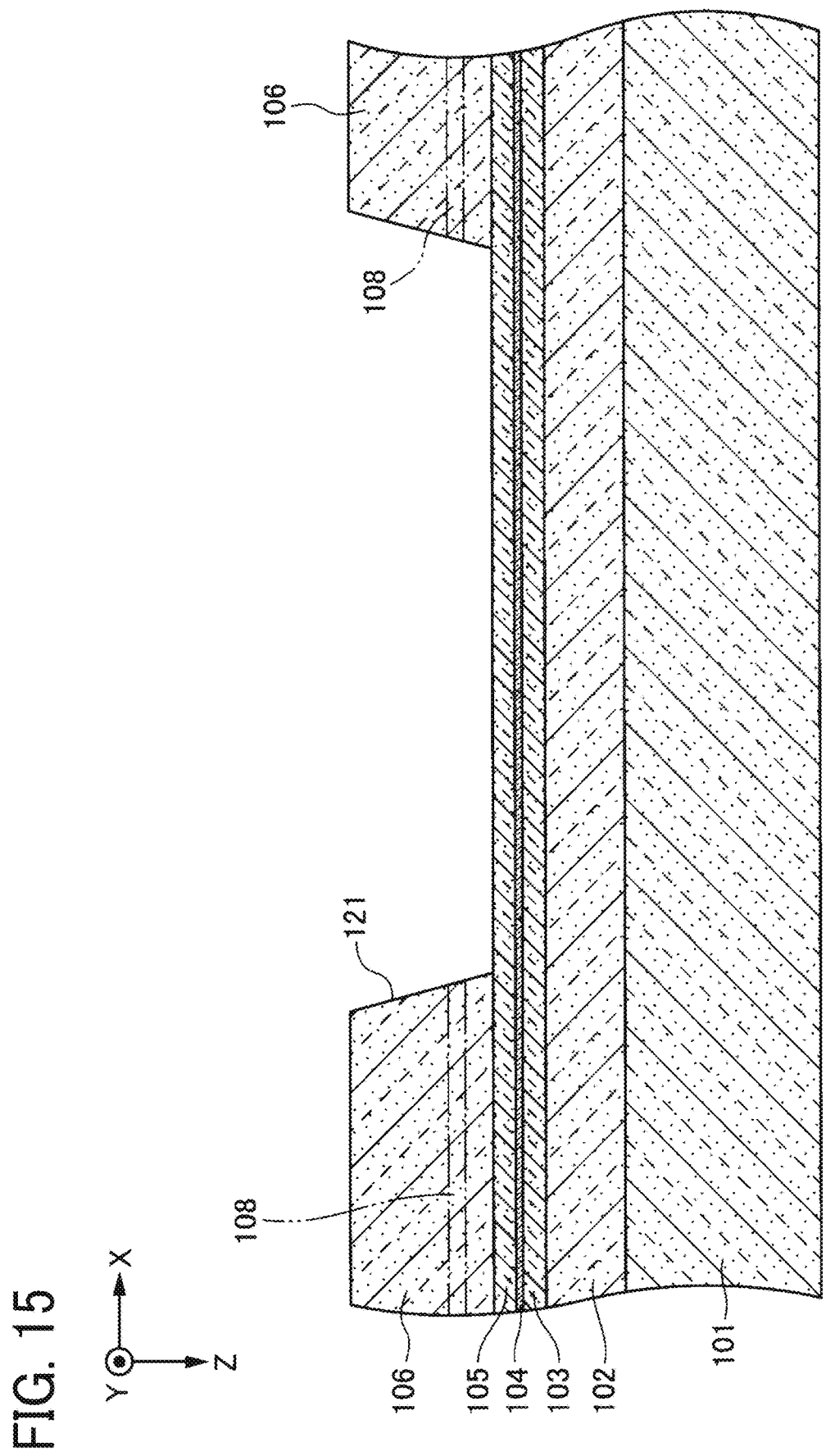
FIG. 15 is another cross-sectional view of the surface emitting laser in FIG. 1 for describing the method for manufacturing the surface emitting laser.

As illustrated in FIG. 10, the upper semiconductor-multilayer-film reflecting mirror 106 including the selective oxide layer 108 is etched, and a mesa structure is formed in the upper semiconductor-multilayer-film reflecting mirror 106 in a region corresponding to the surface emitting laser element 151. As the etching, for example, inductively coupled plasma (ICP) dry etching or electron cyclotron resonance (ECR) dry etching can be performed. In this case, as illustrated in FIG. 15, in a region corresponding to the n-side contact region 156, a groove 121 is formed in the upper semiconductor-multilayer-film reflecting mirror 106.

Figure 11:
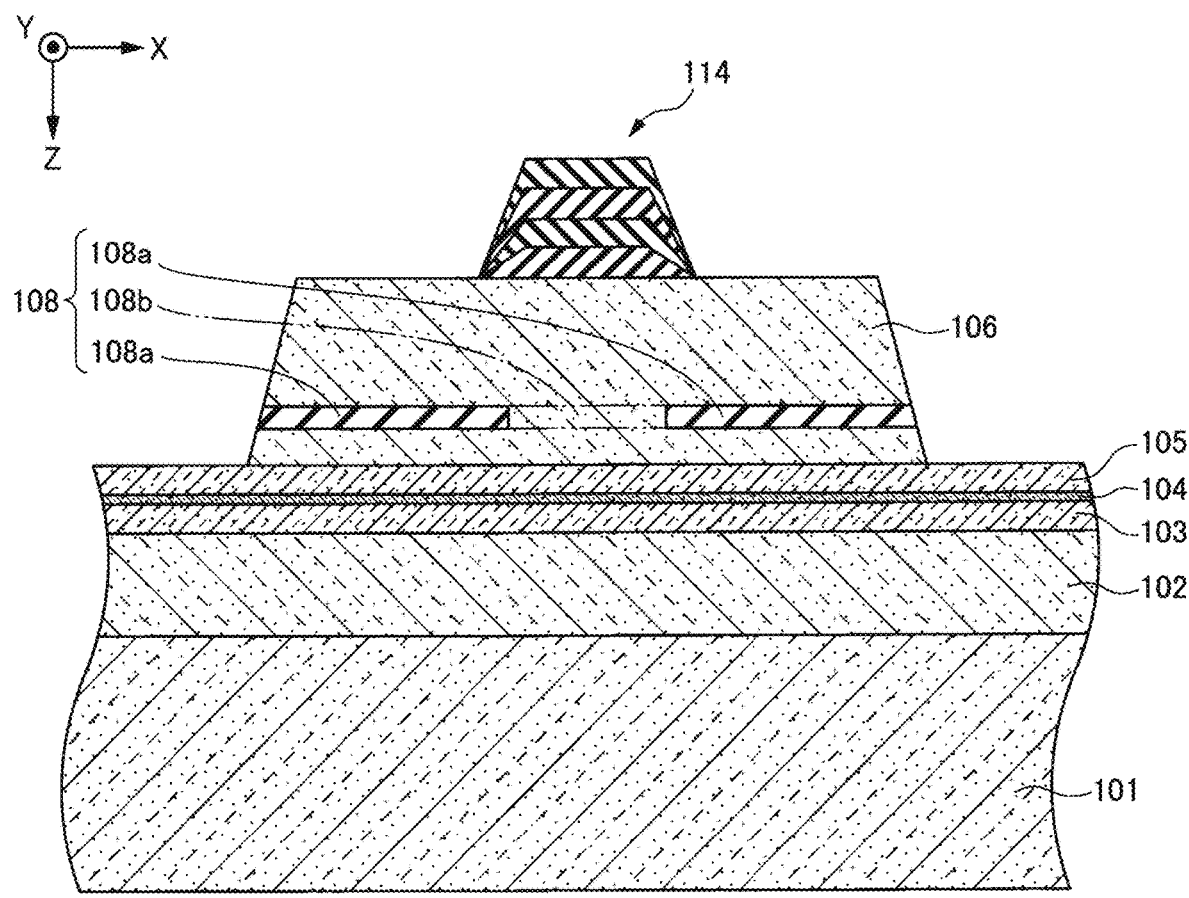
FIG. 11 is another cross-sectional view of the surface emitting laser in FIG. 1 for describing the method for manufacturing the surface emitting laser.
Figure 16:
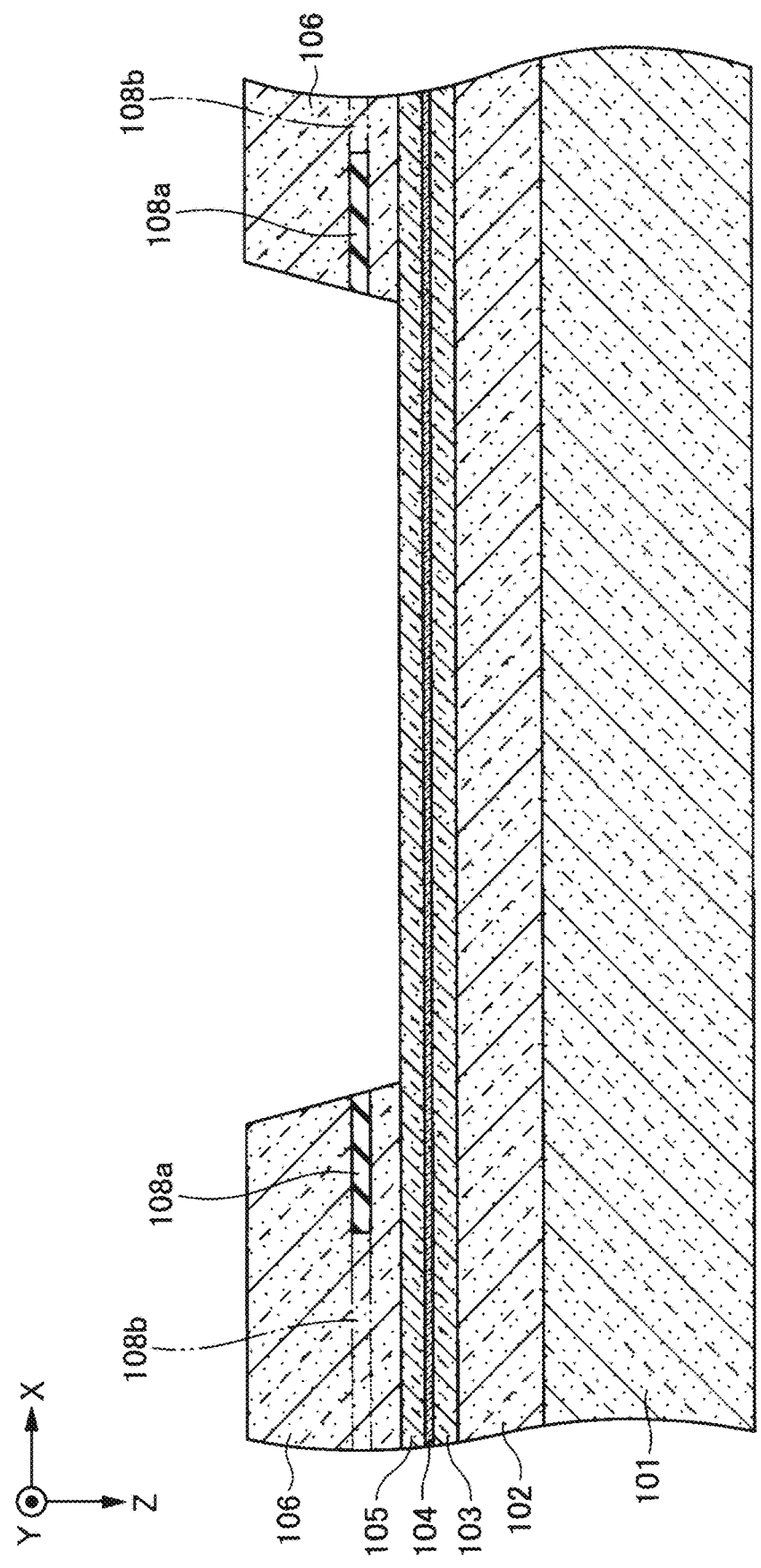
FIG. 16 is another cross-sectional view of the surface emitting laser in FIG. 1 for describing the method for manufacturing the surface emitting laser.

Then, as illustrated in FIGS. 11 and 16, the stacked body is subjected to heat treatment in water vapor. Thus, aluminum (Al) in the selective oxide layer 108 is selectively oxidized from the outer peripheral portion of the mesa structure, and the non-oxidized region 108b surrounded by the oxidized region 108a of the Al remains in the center portion of the mesa structure. That is, a so-called oxidized confinement structure is formed to restrict the path of the driving current of a light emitter to the center portion of the mesa structure. The non-oxidized region 108b is a current passing region.

Figure 17:
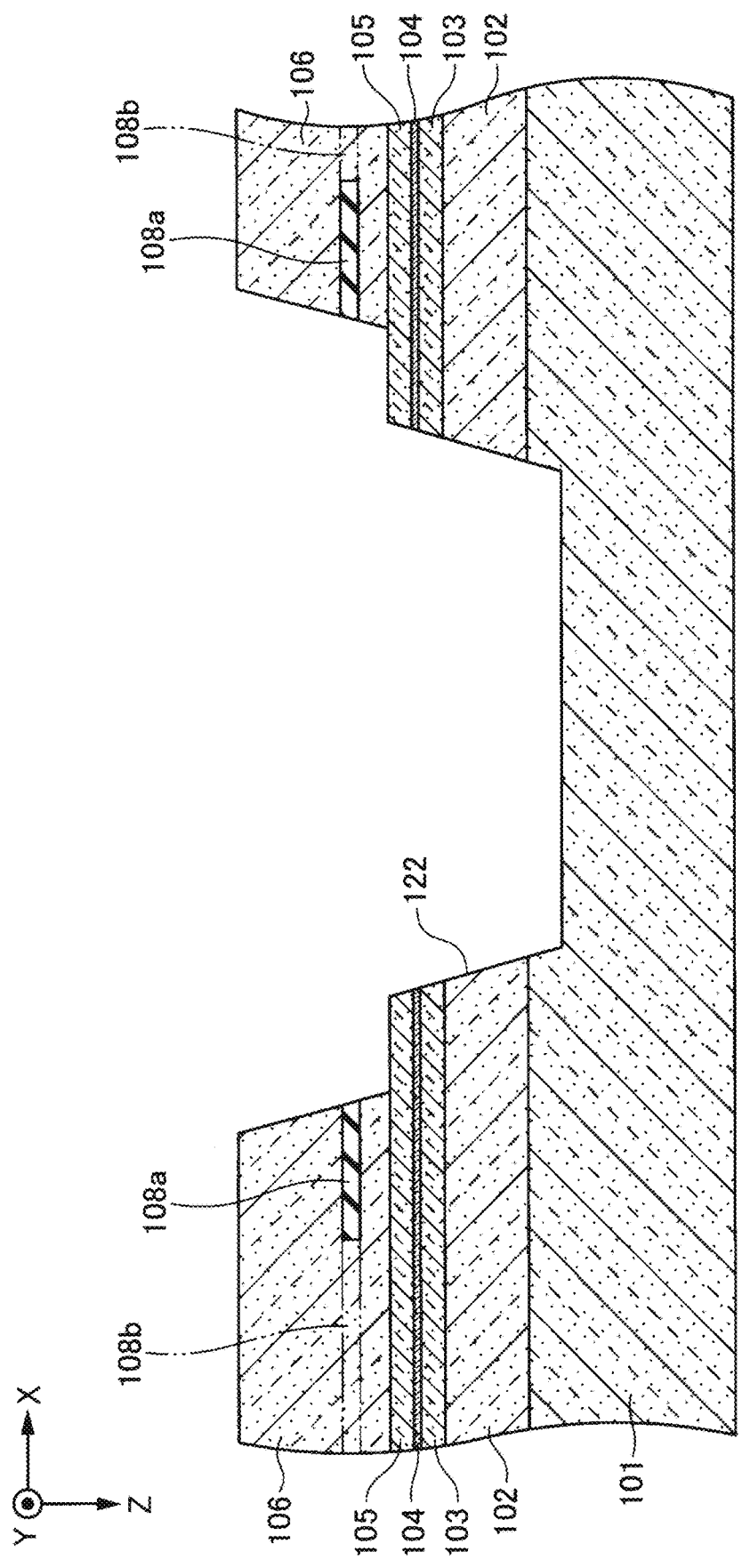
FIG. 17 is another cross-sectional view of the surface emitting laser in FIG. 1 for describing the method for manufacturing the surface emitting laser.

Then, as illustrated in FIG. 17, the upper spacer layer 105, the active layer 104, the lower spacer layer 103, the lower semiconductor-multilayer-film reflecting mirror 102, and the surface layer portion of the substrate 101 are etched to form the groove 122 in the upper spacer layer 105, the active layer 104, the lower spacer layer 103, the lower semiconductor-multilayer-film reflecting mirror 102, and the surface layer portion of the substrate 101 in the region corresponding to the n-side contact region 156. The etching for forming the groove 122 after the selective oxidation of the selective oxide layer 108 can avoid damage to the selective oxide layer 108 before the selective oxidation. In the region corresponding to the surface emitting laser element 151, the upper spacer layer 105, the active layer 104, the lower spacer layer 103, the lower semiconductor-multilayer-film reflecting mirror 102, and the surface layer portion of the substrate 101 are left without being etched (FIG. 11).

Figure 12:
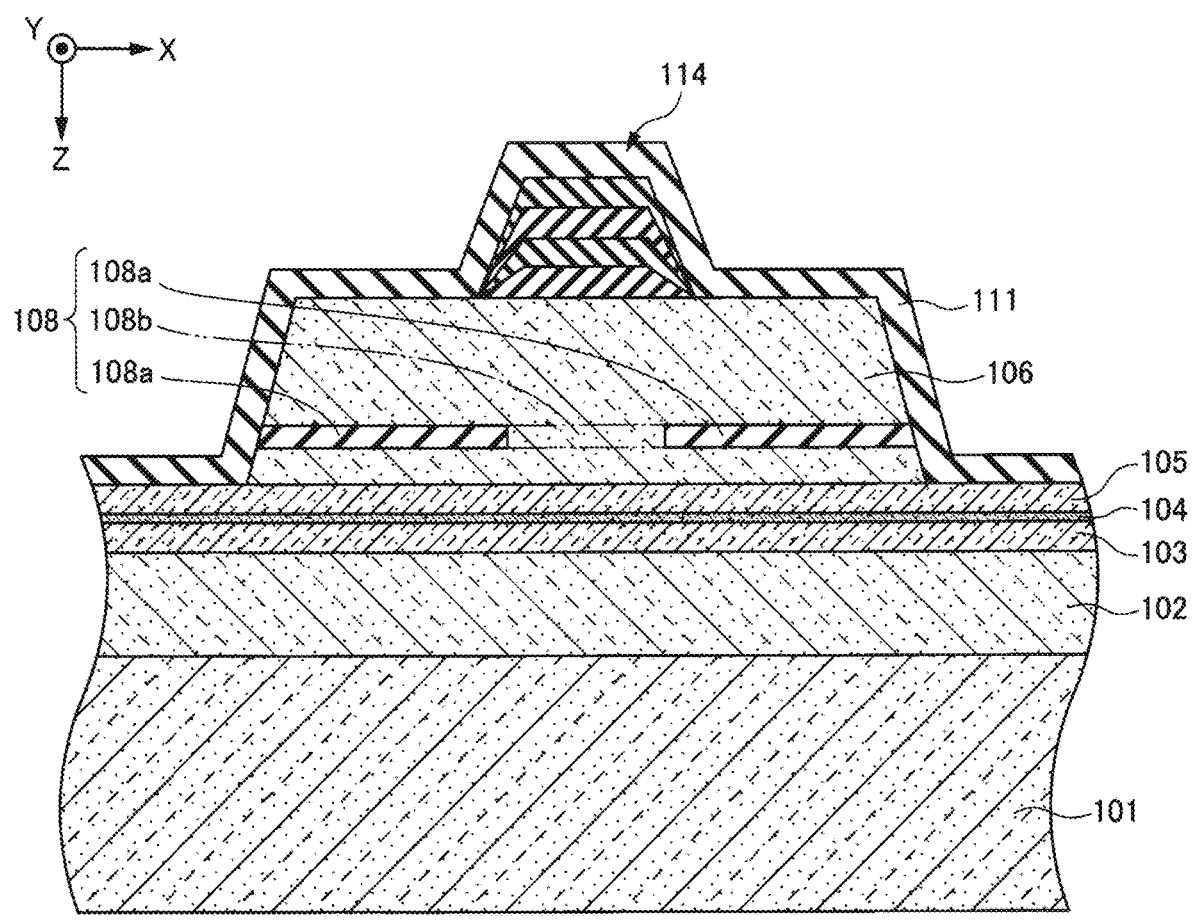
FIG. 12 is another cross-sectional view of the surface emitting laser in FIG. 1 for describing the method for manufacturing the surface emitting laser.
Figure 18:
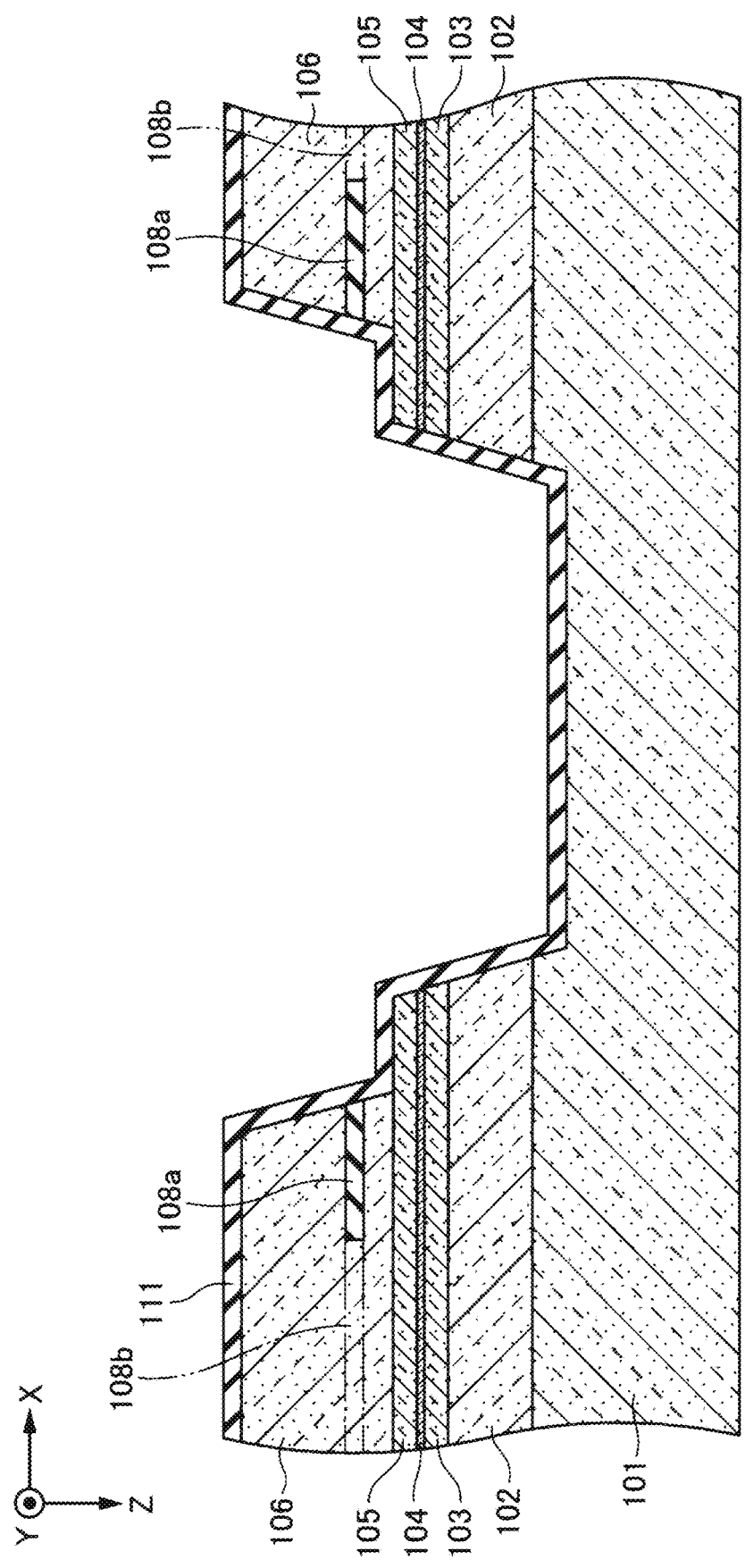
FIG. 18 is another cross-sectional view of the surface emitting laser in FIG. 1 for describing the method for manufacturing the surface emitting laser.

Then, as illustrated in FIGS. 12 and 18, the insulator film 111 is formed on the entire surface 101B of the substrate 101. The insulator film 111 can be formed by, for example, a chemical vapor deposition (CVD) method.

Figure 13:
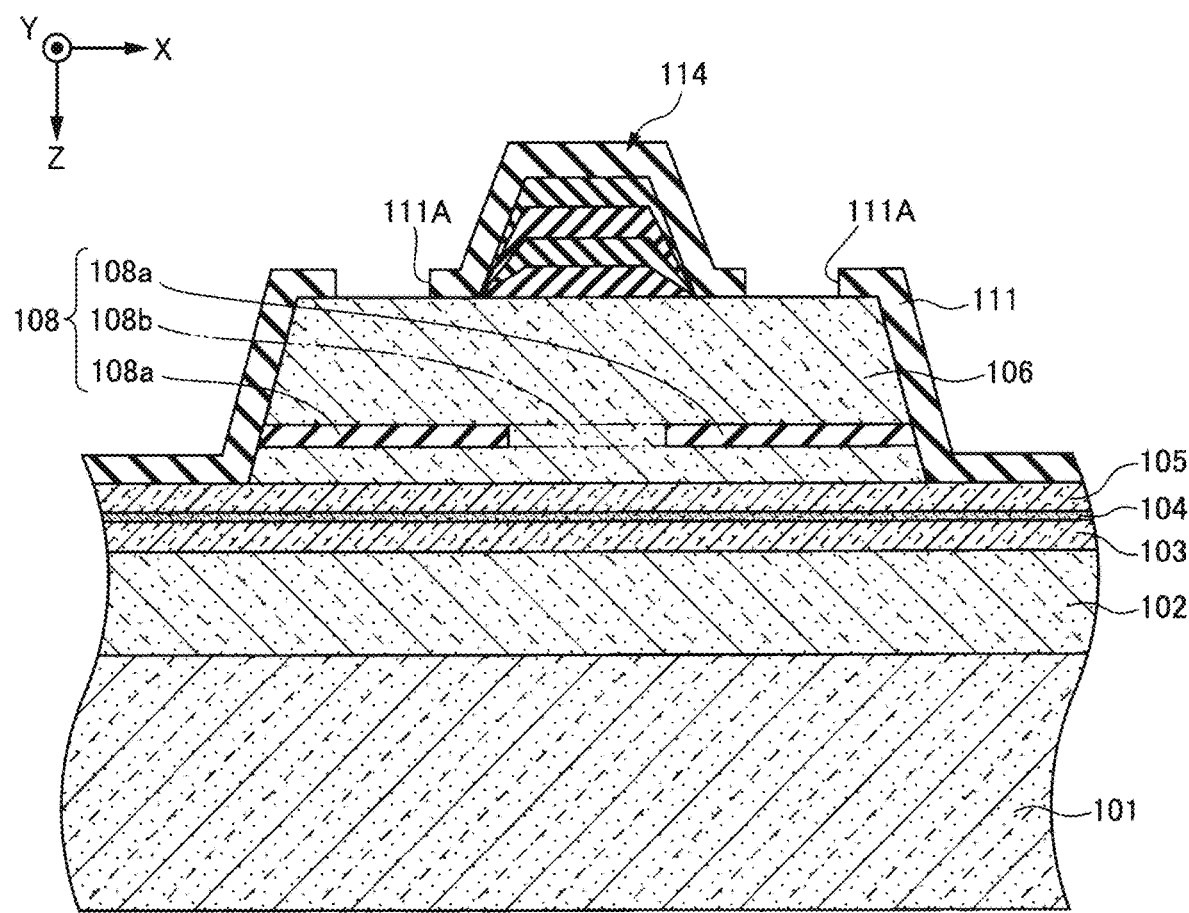
FIG. 13 is another cross-sectional view of the surface emitting laser in FIG. 1 for describing the method for manufacturing the surface emitting laser.
Figure 19:
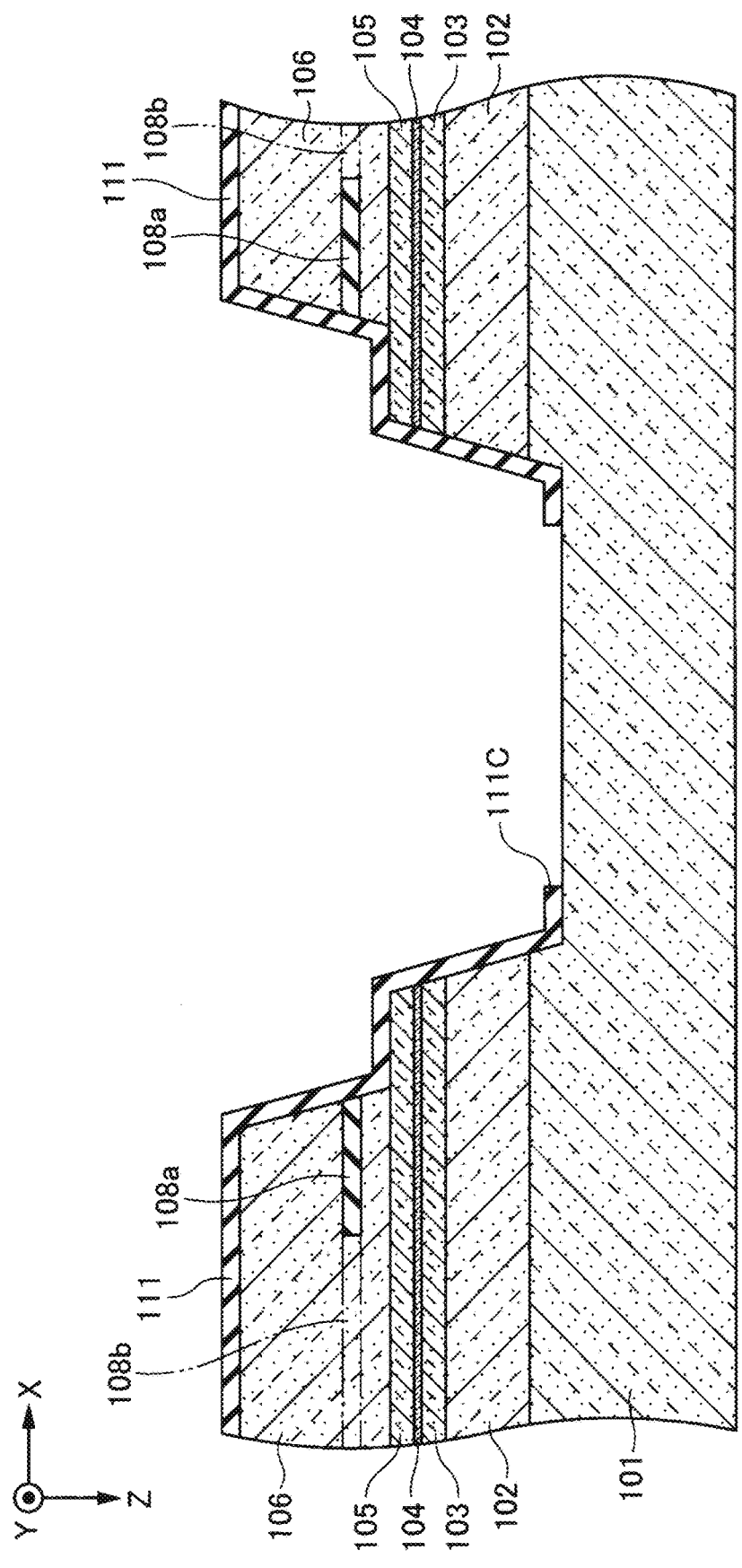
FIG. 19 is another cross-sectional view of the surface emitting laser in FIG. 1 for describing the method for manufacturing the surface emitting laser.

Then, as illustrated in FIGS. 13 and 19, the openings 111A and 111C are formed in the insulator film 111. The openings 111A and 111C can be formed by wet etching using, for example, buffered hydrofluoric acid (BHF).

Figure 14:
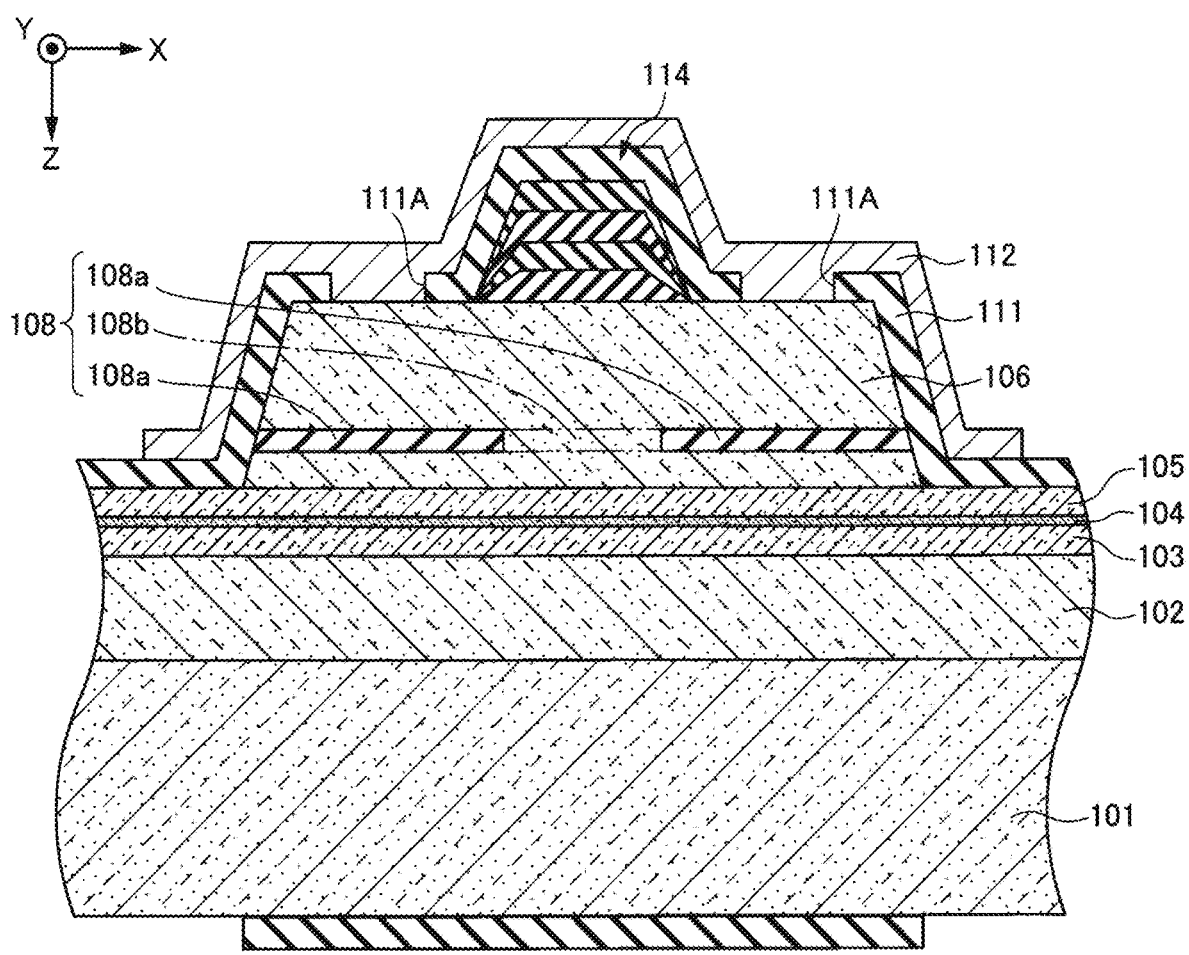
FIG. 14 is another cross-sectional view of the surface emitting laser in FIG. 1 for describing the method for manufacturing the surface emitting laser.
Figure 20:
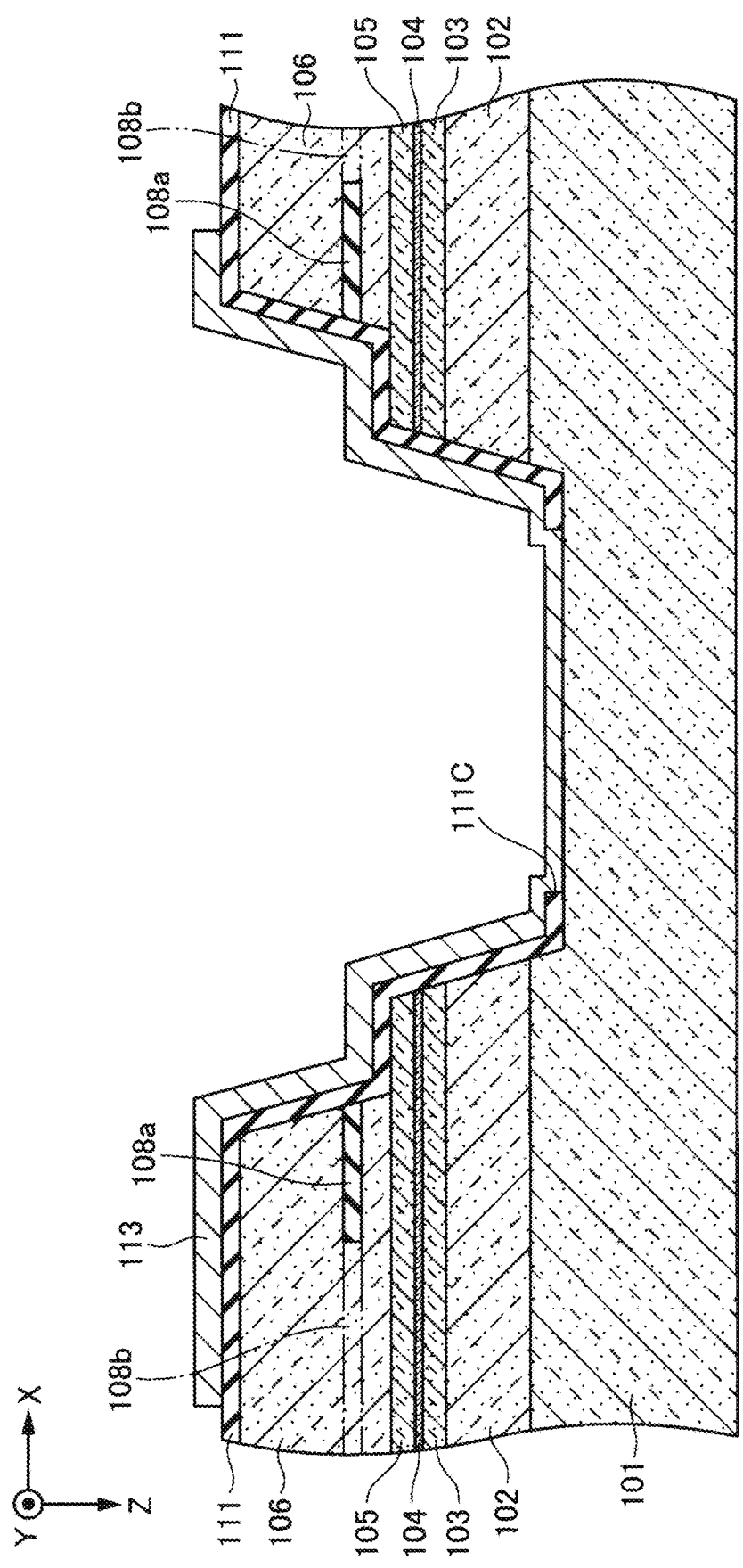
FIG. 20 is another cross-sectional view of the surface emitting laser in FIG. 1 for describing the method for manufacturing the surface emitting laser.

Then, as illustrated in FIG. 14, in the region corresponding to the surface emitting laser element 151, the p-side electrode 112 is formed. As illustrated in FIG. 20, the n-side electrode 113 is formed in the region corresponding to the n-side contact region 156. The p-side electrode 112 and the n-side electrode 113 can be formed by, for example, a lift-off method. Either of the p-side electrode 112 and the n-side electrode 113 may be formed first. To form the p-side electrode 112 and the n-side electrode 113, after the film formation, heat treatment is performed in a reducing atmosphere or an inert atmosphere, and ohmic conduction is established by the eutectic reaction of the semiconductor material and the electrode material.

Then, the back surface 101A of the substrate 101 is polished and mirror-finished, and the anti-reflection film 115 is formed on the back surface 101A (see FIGS. 2 and 3).

In this way, it is possible to manufacture the surface emitting laser 100.

The resist mask 310 used for forming the dielectric multilayer film 114 may not include the first resist mask 311 and the second resist mask 312, and a resist mask having a monolayer structure may be used as the resist mask 310.

Figure 21:
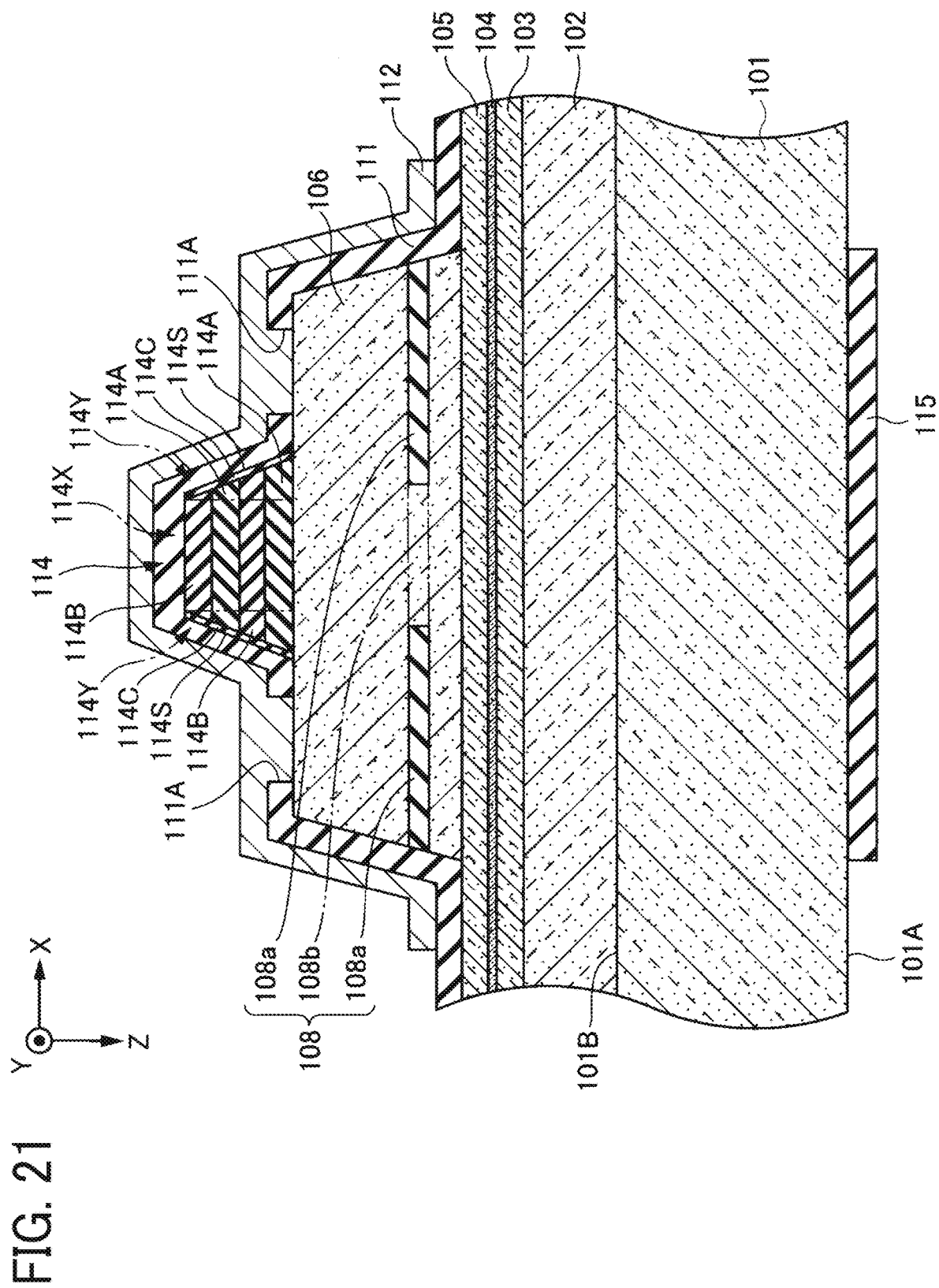
FIG. 21 is a cross-sectional view of an internal structure of a surface emitting laser according to a first modification of the embodiment.

A first modification of the first embodiment is described next. The first modification differs from the first embodiment mainly for the configuration of the dielectric multilayer film. FIG. 21 is a cross-sectional view illustrating an internal structure of a surface emitting laser according to the first modification of the first embodiment.

In the first modification of the first embodiment, as illustrated in FIG. 21, a dielectric multilayer film 114 has a center portion 114X and a peripheral portion 114Y, and the peripheral portion 114Y has a side surface 114S of the dielectric multilayer film 114, as in the first embodiment. Entirely in the center portion 114X and the peripheral portion 114Y, the thicknesses of the low refractive-index films 114A and the thicknesses of the high refractive-index films 114B are each the optical thickness of $\lambda/4$ where $\lambda$ is the oscillation wavelength. That is, the thicknesses of the low refractive-index films 114A and the high refractive-index films 114B in both pairs in the peripheral portion 114Y are the same as the thicknesses of those in the center portion 114X. Each of the side surfaces of the low refractive-index films 114A and the high refractive-index films 114B in both pairs is inclined with respect to the principal surface of the upper semiconductor-multilayer-film reflecting mirror 106.

In the first modification, the dielectric multilayer film 114 further includes a high refractive-index film 114C that covers the side surfaces of both pairs of the low refractive-index films 114A and the high refractive-index films 114B. For example, a material having the same composition as that of the high refractive-index film 114B can be used for the material of the high refractive-index film 114C. The side surface 114S of the dielectric multilayer film 114 includes one high refractive-index film 114C. The high refractive-index film 114C is an example of a third film.

The other configurations are similar to those in the first embodiment.

Also in the first modification, the reflectivity of the portion where the center portion 114X of the dielectric multilayer film 114 overlaps the upper semiconductor-multilayer-film reflecting mirror 106, that is, the reflectivity of the center portion of the mesa structure in plan view is, for example, about 99.9%. The optical thickness of the peripheral portion 114Y is shifted from an integer multiple of $\lambda/2$ in the entire peripheral portion 114Y. That is, the peripheral portion 114Y does not include a portion where the optical thickness (the optical path length of the laser beam having the wavelength of $\lambda$) is an integer multiple of $\lambda/2$. Thus, even with the first modification, it is possible to increase the manufacturing yield while reducing the high-order transverse mode oscillation.

Instead of the high refractive-index film 114C, a low refractive-index film made of the same material as the material of the low refractive-index film 114A may be used, and the side surface 114S of the dielectric multilayer film 114 may be made of the same material as the material of the low refractive-index film 114A.

Figure 22:
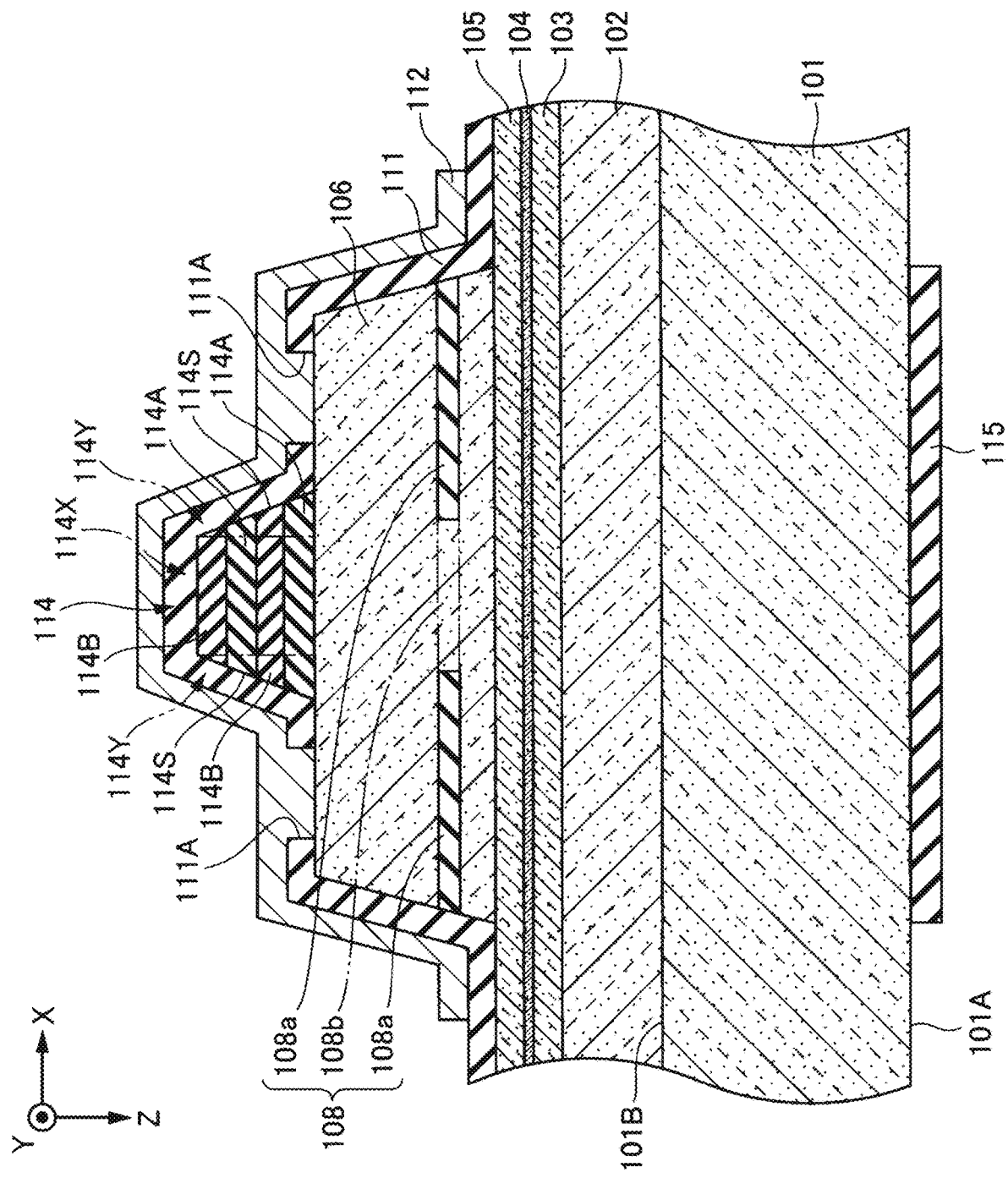
FIG. 22 is a cross-sectional view of an internal structure of a surface emitting laser according to a second modification of the embodiment.

A second modification of the first embodiment is described next. The second modification differs from the first embodiment mainly for the configuration of the dielectric multilayer film. FIG. 22 is a cross-sectional view illustrating an internal structure of a surface emitting laser according to the second modification of the first embodiment.

In the second modification of the first embodiment, as illustrated in FIG. 22, a dielectric multilayer film 114 has a center portion 114X and a peripheral portion 114Y, and the peripheral portion 114Y has a side surface 114S of the dielectric multilayer film 114, as in the first embodiment. Entirely in the center portion 114X and the peripheral portion 114Y, the thicknesses of the low refractive-index films 114A and the thicknesses of the high refractive-index films 114B are each the optical thickness of $\lambda/4$ where $\lambda$ is the oscillation wavelength. That is, the thicknesses of the low refractive-index films 114A and the high refractive-index films 114B in both pairs in the peripheral portion 114Y are the same as the thicknesses of those in the center portion 114X. Each of the side surfaces of the low refractive-index films 114A and the high refractive-index films 114B in both pairs is inclined with respect to the principal surface of the upper semiconductor-multilayer-film reflecting mirror 106.

In the second modification, the side surface 114S of the dielectric multilayer film 114 includes the low refractive-index films 114A and the high refractive-index films 114B. The side surface 114S of the dielectric multilayer film 114 is directly covered with one insulator film 111.

The other configurations are similar to those in the first embodiment.

Also in the second modification, the reflectivity of the portion where the center portion 114X of the dielectric multilayer film 114 overlaps the upper semiconductor-multilayer-film reflecting mirror 106, that is, the reflectivity of the center portion of the mesa structure in plan view is, for example, about 99.9%. The side surface 114S is directly covered with the insulator film 111, and hence the refractive index of the insulator film 111 affects the refractive index of the peripheral portion 114Y. Hence, the peripheral portion 114Y does not include a portion where the optical thickness (the optical path length of the laser beam having the wavelength $\lambda$) is an integer multiple of $\lambda/2$. Thus, even with the second modification, it is possible to increase the manufacturing yield while reducing the high-order transverse mode oscillation.

The planar shape of the dielectric multilayer film 114 is not particularly limited to a particular shape. FIGS. 23A to 23F illustrate examples of the planar shape of the dielectric multilayer film 114.

For example, as illustrated in FIG. 23A, the planar shape of the dielectric multilayer film 114 may be a circular shape. As illustrated in FIG. 23B, the planar shape of the dielectric multilayer film 114 may be a square shape.

The planar shape of the dielectric multilayer film 114 may be an anisotropic shape. In the present disclosure, the anisotropic shape refers to a shape that does not overlap the original shape when rotated by 90 degrees. In one example, the planar shapes of the dielectric multilayer film 114 in two directions orthogonal to each other differ from each other. In another example, the widths of the dielectric multilayer film 114 in the two directions orthogonal to each other differ from each other. For example, as illustrated in FIG. 23C, the planar shape of the dielectric multilayer film 114 may have a circular portion, a portion extending from the circular portion toward the +Y side, and a portion extending from the circular portion toward the −Y side. As illustrated in FIG. 23D, the planar shape of the dielectric multilayer film 114 may have a square portion, a portion extending from the square portion toward the +Y side, and a portion extending from the square portion toward the −Y side. As illustrated in FIG. 23E, the planar shape of the dielectric multilayer film 114 may be an elliptic shape having the major axis in the Y-axis direction. As illustrated in FIG. 23F, the planar shape of the dielectric multilayer film 114 may be a rectangular shape having the longitudinal direction in the Y-axis direction.

When the planar shape of the dielectric multilayer film 114 is an anisotropic shape, anisotropy is applied to the optical loss of the surface emitting laser element 151, and the loss of the mode having a specific polarization component increases, and oscillation is reduced. Consequently, it is possible to obtain a laser output in which the polarization directions are aligned.

To control deflection, in one example, the substrate 101 is an inclined substrate. In one example, any of the anisotropic directions of the dielectric multilayer film 114 is parallel to the inclination direction of the inclined substrate.

Note that a semiconductor multilayer film may be used instead of the dielectric multilayer film 114.

Figure 24:
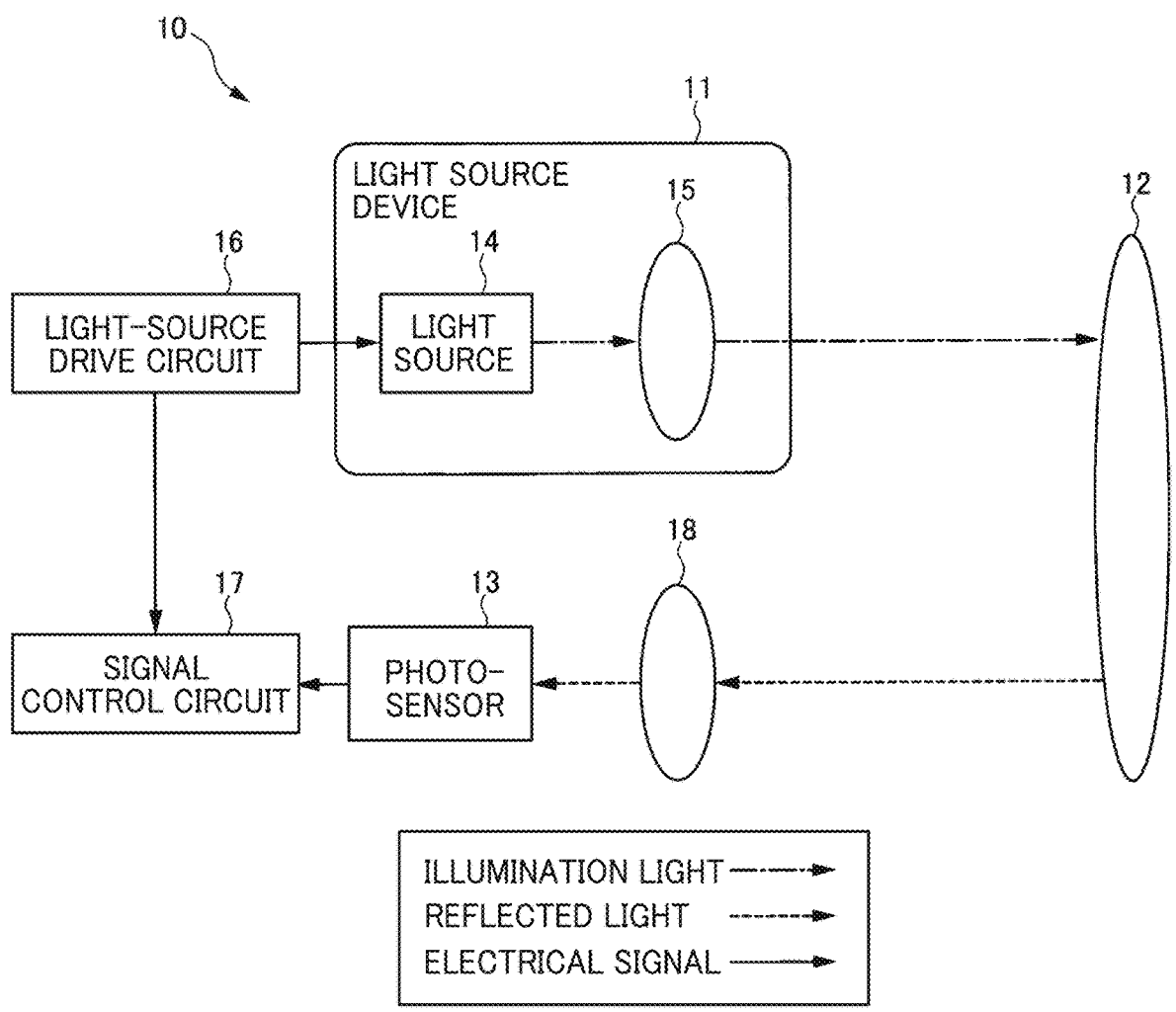
FIG. 24 is a diagram of a distance measuring apparatus as an example of a detection apparatus.

A second embodiment is described next. The second embodiment relates to a light source device and a detection apparatus including the surface emitting laser 100 according to the first embodiment. FIG. 24 illustrates an overview of a distance measuring apparatus 10 as an example of the detection apparatus.

The distance measuring apparatus 10 includes a light source device 11 as an example of the light source device. The distance measuring apparatus 10 is a time-of-flight (TOF) distance detection apparatus that provides projection (irradiation) with pulsed light from the light source device 11 to an object to be detected 12, receives the reflected light from the object to be detected 12 by a photosensor 13, and measures the distance from the object to be detected 12 based on the time required for receiving the reflected light.

As illustrated in FIG. 24, the light source device 11 includes a light source 14 and an optical system 15. The light source 14 includes the surface emitting laser 100 according to the first embodiment, and the emission of light of the light source 14 is controlled based on electric current sent from a light-source drive circuit 16. The light-source drive circuit 16 transmits a signal to a signal control circuit 17 when the light source 14 is caused to emit light. The optical system 15 includes an optical element, such as a lens, a diffractive-optical element (DOE), or a prism, that adjusts the angle of divergence or direction of the light emitted from the light source 14, and irradiates the object to be detected 12 with the light.

The light that is projected from the light source device 11 and then reflected by the object to be detected 12 is guided to the photosensor 13 through a light receiving optical system 18 that has a light focusing effect. The photosensor 13 includes a photoelectric conversion element. The light that is received by the photosensor 13 is photoelectrically converted, and the photoelectrically-converted light is sent to the signal control circuit 17 as an electrical signal. The signal control circuit 17 calculates the distance to the object to be detected 12 based on the time difference between the timing of light projection (i.e., the timing at which a light emission signal is input from the light-source drive circuit 16) and the timing of light reception (i.e., the timing at which a light reception signal is input from the photosensor 13). Accordingly, in the distance measuring apparatus 10, the light receiving optical system 18 and the photosensor 13 function as a detection system on which the light emitted from the light source device 11 and reflected by the object to be detected 12 is incident. The signal control circuit 17 may be configured so as to obtain, for example, information about the presence or absence of the object to be detected 12 and the relative velocity of the object to be detected 12, based on a signal sent from the photosensor 13.

In the present embodiment, since the surface emitting laser 100 that emits a high-power light beam of a single transverse mode is used, it is possible to perform detection and measurement with higher accuracy.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

The invention claimed is:

1. A surface emitting laser element, comprising:
a first reflecting mirror;
an active layer over the first reflecting mirror;
a second reflecting mirror over the active layer;
a multilayer film over the second reflecting mirror, the multilayer film having a center portion and a peripheral portion around the center portion in plan view in a direction perpendicular to a principal surface of the second reflecting mirror;
a first portion where the center portion overlaps the second reflecting mirror in the plan view; and
a second portion where the peripheral portion overlaps the second reflecting mirror in the plan view, wherein
the multilayer film has a side surface including one film inclined with respect to the principal surface of the second reflecting mirror, the peripheral portion including the side surface,
the multilayer film includes, in a thickness direction, two or more pairs of a first film having a first refractive index and a second film having a second refractive index higher than the first refractive index, and
a first reflectivity of the first portion is greater than a second reflectivity of the second portion.

2. The surface emitting laser element according to claim 1, wherein the one film is the second film included in an uppermost one of the two or more pairs.

3. The surface emitting laser element according to claim 1, wherein the multilayer film has two or more pairs of the first film and the second film entirely in the center portion and the peripheral portion.

4. The surface emitting laser element according to claim 3, wherein a ratio of a thickness of the first film to a thickness of the second film in the center portion is equal to a ratio of a thickness of the first film to a thickness of the second film in the peripheral portion.

5. The surface emitting laser element according to claim 1, wherein the one film includes a third film having a same composition as a composition of the second film.

6. The surface emitting laser element according to claim 1, wherein
the first reflecting mirror and the second reflecting mirror each include a semiconductor-multilayer-film reflecting mirror, and
the first film and the second film each include a dielectric film.

7. The surface emitting laser element according to claim 1, wherein light is emitted from a side of the first reflecting mirror.

8. A surface emitting laser, comprising:
a substrate; and
a plurality of surface emitting laser elements each according to claim 1, wherein
the plurality of surface emitting laser elements are on the substrate, and
for each surface emitting laser element, the first reflecting mirror is nearer the substrate than the second reflecting mirror.

9. A surface emitting laser device, comprising:
a mount substrate; and
the surface emitting laser according to claim 8 mounted on the mount substrate.

10. A light source device, comprising:
the surface emitting laser device according to claim 9; and
a driver configured to drive the surface emitting laser device.

11. A detection apparatus, comprising:
the light source device according to claim 10; and
a photosensor configured to detect light emitted outside from the surface emitting laser and reflected by an object.

12. The surface emitting laser element according to claim 1, wherein the second reflectivity monotonously decreases with an increase in a distance from the center portion in a direction orthogonal to the thickness direction.

13. The surface emitting laser element according to claim 1, further comprising:
a confinement structure disposed in an electrical path to the active layer, the confinement structure including a current passing region through which a current passes, wherein
the center portion of the multilayer film is above the current passing region.

14. A surface emitting laser element comprising:
a first reflecting mirror;
an active layer over the first reflecting mirror;
a second reflecting mirror over the active layer;
a multilayer film over the second reflecting mirror, the multilayer film having a center portion and a peripheral portion around the center portion in plan view in a direction perpendicular to a principal surface of the second reflecting mirror;
a first portion where the center portion overlaps the second reflecting mirror in the plan view; and
a second portion where the peripheral portion overlaps the second reflecting mirror in the plan view, wherein
the multilayer film has a side surface inclined with respect to the principal surface of the second reflecting mirror and covered with one film, the peripheral portion including the side surface,
the multilayer film includes, in a thickness direction, two or more pairs of a first film having a first refractive index and a second film having a second refractive index higher than the first refractive index, and
the peripheral portion has a reflectivity lower than a reflectivity of the center portion.

15. The surface emitting laser element according to claim 14, wherein
the first reflecting minor and the second reflecting mirror each include a semiconductor-multilayer-film reflecting mirror, and the first film and the second film each include a dielectric film.

16. The surface emitting laser element according to claim 14, wherein light is emitted from a side of the first reflecting mirror.

17. A surface emitting laser, comprising:
a substrate; and
a plurality of surface emitting laser elements each according to claim 14, wherein
the plurality of surface emitting laser elements are on the substrate, and
for each surface emitting laser element, the first reflecting mirror is nearer the substrate than the second reflecting mirror.

18. A surface emitting laser device, comprising:
a mount substrate; and
the surface emitting laser according to claim 17 mounted on the mount substrate.

19. A light source device, comprising:
the surface emitting laser device according to claim 18; and
a driver configured to drive the surface emitting laser device.

20. A detection apparatus, comprising:
the light source device according to claim 19; and
a photosensor configured to detect light emitted outside from the surface emitting laser and reflected by an object.

* * * * *